US010354571B2

United States Patent
Tashiro

(10) Patent No.: US 10,354,571 B2
(45) Date of Patent: Jul. 16, 2019

(54) DRIVER IC INCLUDING AN ABNORMALITY DETECTION PART FOR DETECTING ABNORMALITIES, A WAVEFORM-CHANGING PART FOR CHANGING WAVEFORMS, AND AN OUTPUT PART FOR OUTPUTTING SIGNALS, AND LIQUID CRYSTAL DISPLAY DEVICE COMPRISING THE SAME

(71) Applicant: Mitsubishi Electric Corporation, Tokyo (JP)

(72) Inventor: Tomohiro Tashiro, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/849,761

(22) Filed: Dec. 21, 2017

(65) Prior Publication Data

US 2018/0190171 A1    Jul. 5, 2018

(30) Foreign Application Priority Data

Jan. 5, 2017    (JP) .................. 2017-000393

(51) Int. Cl.
| | |
|---|---|
| G09G 3/36 | (2006.01) |
| G09G 3/00 | (2006.01) |
| G09G 3/20 | (2006.01) |
| H03K 19/20 | (2006.01) |
| H03K 19/21 | (2006.01) |

(52) U.S. Cl.
CPC ............ *G09G 3/006* (2013.01); *G09G 3/20* (2013.01); *G09G 3/3677* (2013.01); *G09G 3/3688* (2013.01); *G09G 2310/0267* (2013.01); *G09G 2310/0286* (2013.01); *G09G 2310/0289* (2013.01); *G09G 2310/0291* (2013.01); *G09G 2310/06* (2013.01); *G09G 2310/08* (2013.01); *G09G 2330/12* (2013.01); *H03K 19/20* (2013.01); *H03K 19/21* (2013.01)

(58) Field of Classification Search
CPC ........................ G09G 3/3674; G09G 3/3677
See application file for complete search history.

(56) References Cited

U.S. PATENT DOCUMENTS

| | | | |
|---|---|---|---|
| 5,563,624 | A | 10/1996 | Imamura |
| 6,166,726 | A | 12/2000 | Uchida et al. |
| 6,300,797 | B1 | 10/2001 | Koizumi |
| RE40,504 | E | 9/2008 | Imamura |
| 7,944,439 | B2 | 5/2011 | Mamba et al. |

(Continued)

FOREIGN PATENT DOCUMENTS

| | | |
|---|---|---|
| JP | 08-050274 A | 2/1996 |
| JP | 11-014961 A | 1/1999 |

(Continued)

*Primary Examiner* — Roy P Rabindranath
(74) *Attorney, Agent, or Firm* — Studebaker & Brackett PC

(57) ABSTRACT

A driver IC includes an abnormality detection part for detecting at least one of abnormality of an OE signal, abnormality of a VGH being a signal indicating a High-level voltage, and abnormality of a VGL being a signal indicating a Low-level voltage, a waveform-changing part for changing a waveform of an STV signal being a start signal for generating a gate pulse based on a signal output from the abnormality detection part, and an output part for outputting the STV signal.

13 Claims, 17 Drawing Sheets

(56) References Cited

U.S. PATENT DOCUMENTS

| | | |
|---|---|---|
| 8,625,039 B2 | 1/2014 | Tajiri et al. |
| 9,395,783 B2 | 7/2016 | Sakamaki |
| 9,691,344 B2 | 6/2017 | Ota |
| 2004/0100435 A1* | 5/2004 | Baek .................... G09G 3/3677 345/98 |
| 2007/0040789 A1* | 2/2007 | Ha ....................... G09G 3/3677 345/98 |
| 2007/0268059 A1 | 11/2007 | Sakaguchi et al. |
| 2017/0256216 A1* | 9/2017 | Cao .......................... G09G 3/36 |

FOREIGN PATENT DOCUMENTS

| | | |
|---|---|---|
| JP | 11-305721 A | 11/1999 |
| JP | 2000-330094 A | 11/2000 |
| JP | 2000-347614 A | 12/2000 |
| JP | 2001-092417 A | 4/2001 |
| JP | 2004-205588 A | 7/2004 |
| JP | 2005-134655 A | 5/2005 |
| JP | 2007-060732 A | 3/2007 |
| JP | 2007-311971 A | 11/2007 |
| JP | 2008-009290 A | 1/2008 |
| JP | 2009-265216 A | 11/2009 |
| JP | 2010-113299 A | 5/2010 |
| JP | 2011-070055 A | 4/2011 |
| JP | 2013-160999 A | 8/2013 |
| JP | 2014-202792 A | 10/2014 |
| JP | 2015-075609 A | 4/2015 |
| JP | 2015-087471 A | 5/2015 |
| JP | 2015-197484 A | 11/2015 |
| JP | 2015-219383 A | 12/2015 |
| JP | 2016-033608 A | 3/2016 |
| JP | 2016-090703 A | 5/2016 |
| WO | 91/020075 A1 | 12/1991 |

\* cited by examiner

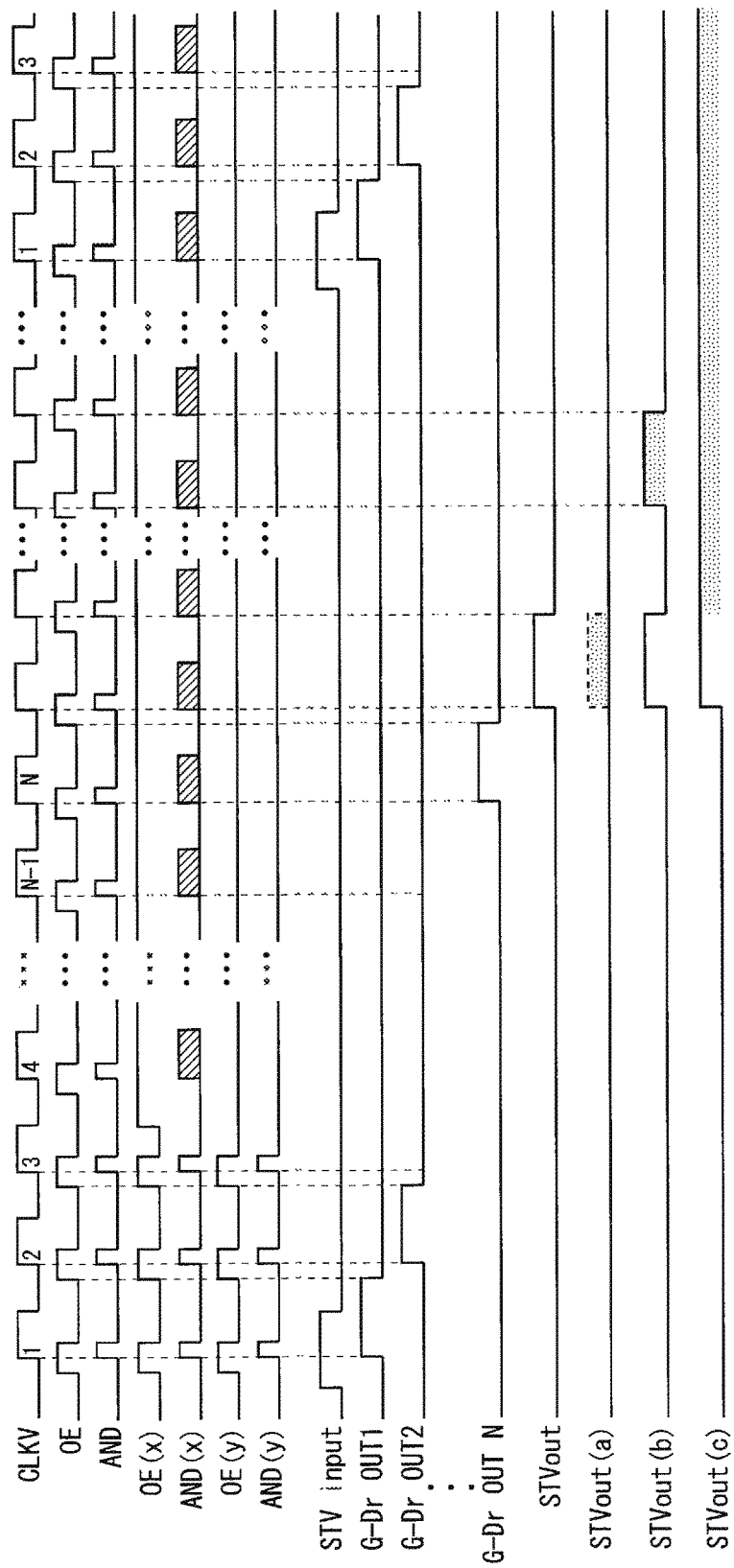

F I G . 1 1
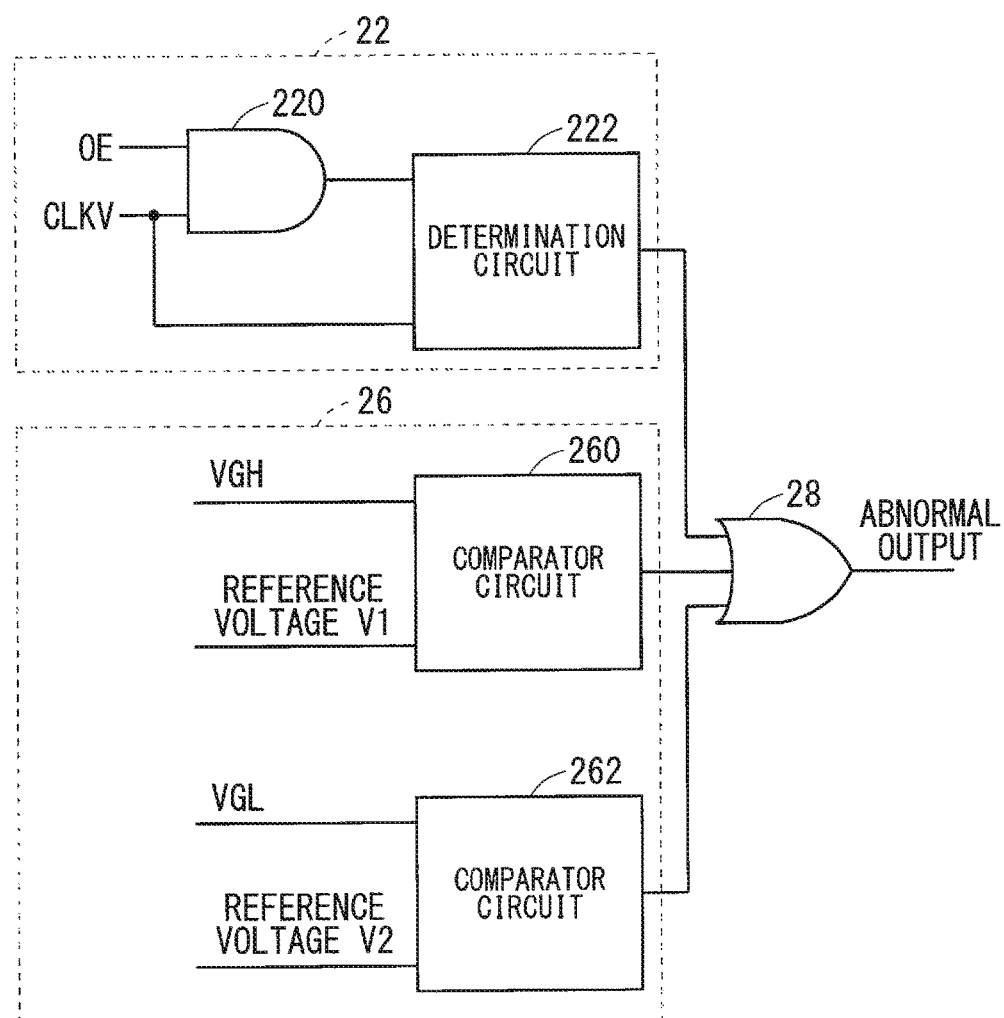

F I G . 1 2
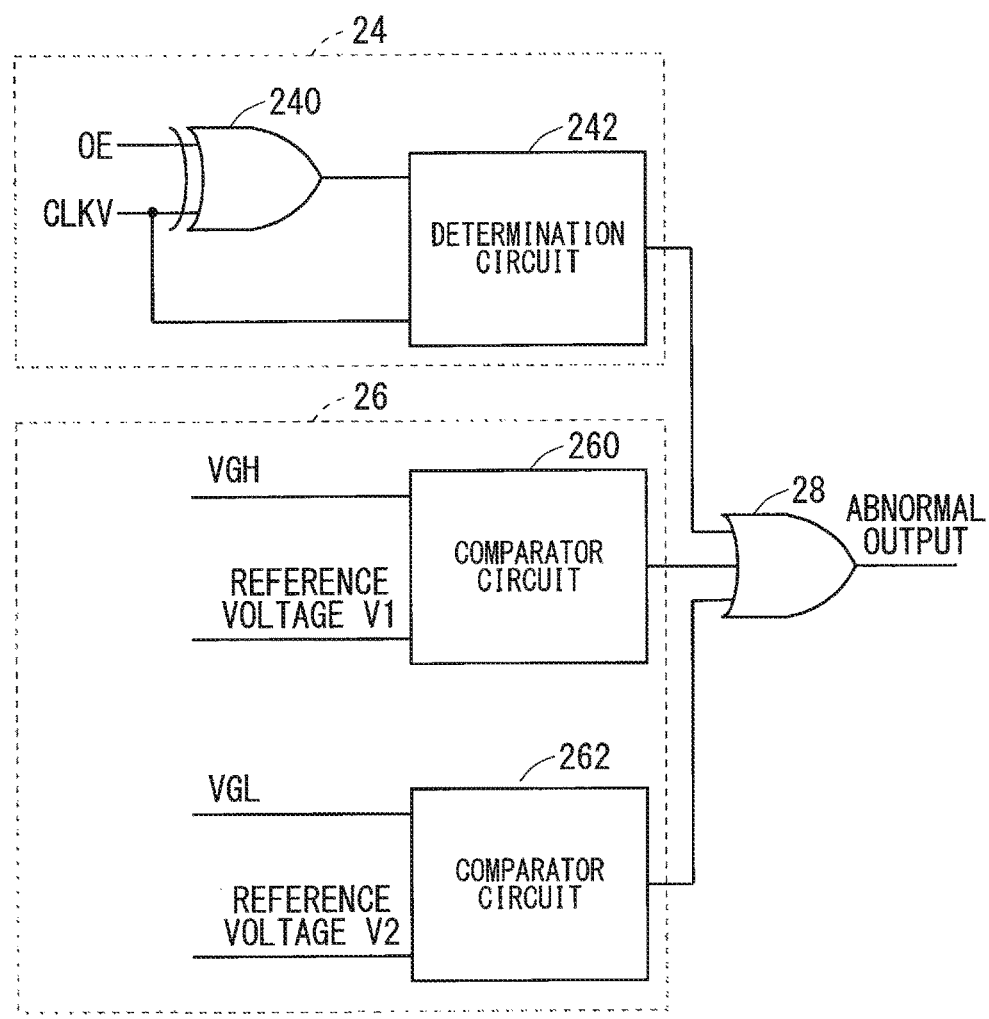

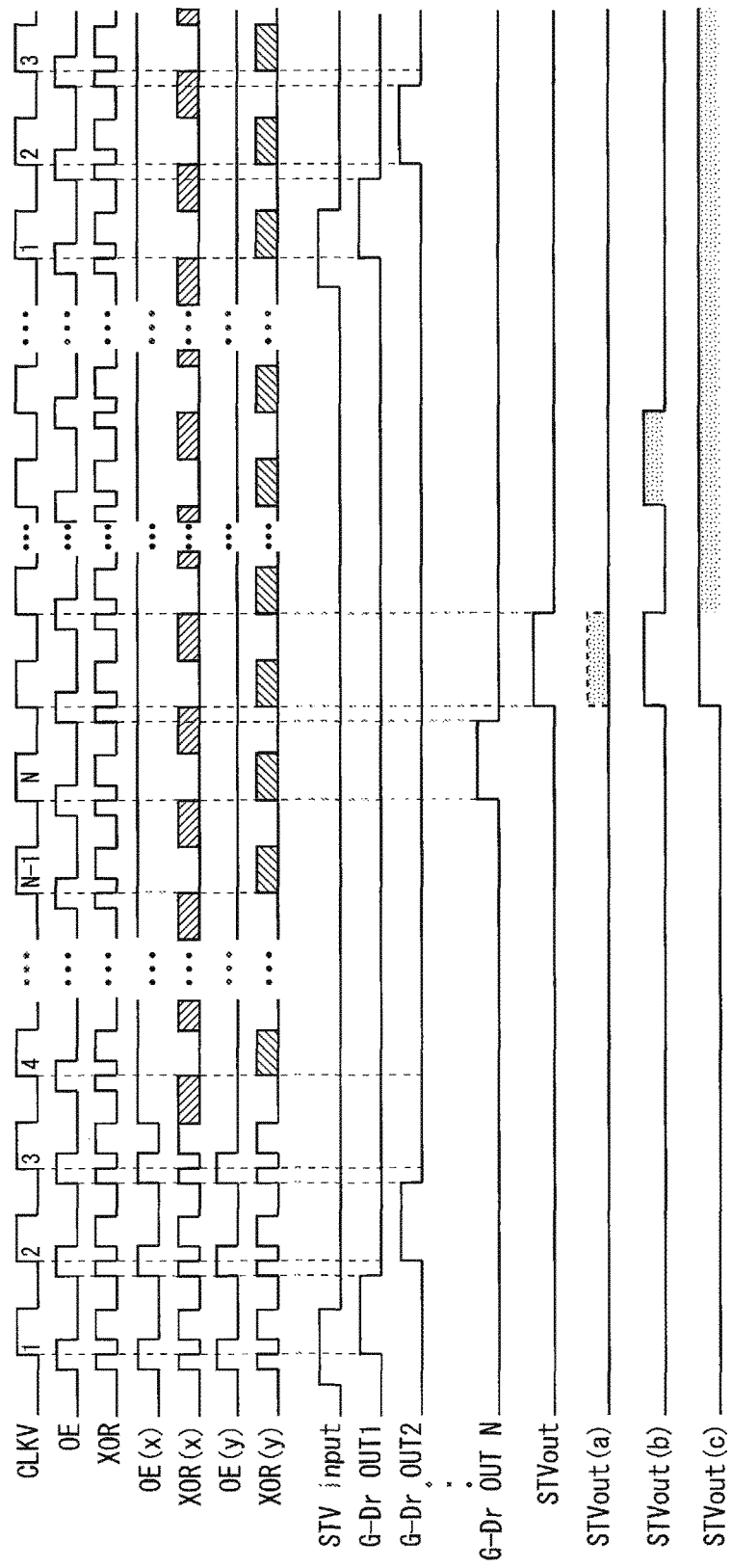

DRIVER IC INCLUDING AN ABNORMALITY DETECTION PART FOR DETECTING ABNORMALITIES, A WAVEFORM-CHANGING PART FOR CHANGING WAVEFORMS, AND AN OUTPUT PART FOR OUTPUTTING SIGNALS, AND LIQUID CRYSTAL DISPLAY DEVICE COMPRISING THE SAME

BACKGROUND OF THE INVENTION

Field of the Invention

A technology disclosed in the specification of this application relates to a driver IC and a liquid crystal display device.

Description of the Background Art

In recent years, in order to reduce a manufacturing cost of a liquid crystal display device, a technology for reducing the number of driver ICs to be used has been developed by increasing the number of output channels in a single driver integrated circuit (IC) for driving liquid crystals.

However, in a tape carrier package (TCP) or a chip on film (COF), an interval between terminals to be attached to a liquid crystal panel cannot be reduced easily. Therefore, particularly in a liquid crystal display device of a small-to-medium size, usage of a chip on glass (COG) has been promoted.

Further, such a technology has also been developed that the same components are used commonly in a plurality of liquid crystal display devices to reduce a total number of components in the plurality of liquid crystal display devices, to thereby reduce a manufacturing cost. In order to reduce development time and design resources, establishing a "platform" in which the same components are used in a wide variety of liquid crystal panels has been promoted.

In general, a liquid crystal display device includes a liquid crystal panel, a circuit board, and a flexible print circuit board (flexible printed circuits, i.e., FPCs) for connecting the liquid crystal panel and the circuit board.

The liquid crystal panel includes a pixel region, a gate driver IC in a vertical axis of a circumferential region of the pixel region, and a source driver IC (also represented as "S-IC") in a horizontal axis of the circumferential region of the pixel region. The gate driver IC performs ON/OFF control of thin film transistors (i.e., TFTs) of pixels.

The circuit board includes a timing controller (TCON), an E2PROM (also referred to as "EEPROM") to store software information for setting of the timing controller, an interface connector, a power supply circuit, and a generation circuit for a gradation reference voltage.

For example, sharing of components such as the timing controller, the E2PROM, the source driver IC, and the gate driver IC among above has been implemented as much as possible.

Meanwhile, particularly in a liquid crystal display device to be used for a vehicle, whether or not the source driver IC and the gate driver IC for driving liquid crystals operate without problems has increasingly been monitored on a system side.

Therefore, the system side monitors the source driver IC and the gate driver IC via the interface connector. Along with this, the number of wires and mounted components in the liquid crystal display device is apt to be increased.

Further, a system construction has been promoted in consideration of ISO 26262 established in 2011, and risk management has also been required. For example, in a mirror-substitution usage, image retention in a liquid crystal display, which may be a factor of causing an accident, needs to be avoided. Therefore, detection of abnormality of the liquid crystal display has been gaining more and more importance. Along with this, the number of monitoring wires and external components mounted in order to detect the abnormality is apt to be increased.

As configuration for recognizing the image retention, for example, the factor is found in a state in which the thin film transistors of pixels are not turned on or not easily turned on, and signals to be input into the gate driver IC, i.e., an output enable (OE) signal from the timing controller and a VGH/VGL voltage from the power supply circuit, correspond thereto.

In general, the OE signal from the timing controller has a function of, under a High-level voltage, disabling an output of the gate driver IC, i.e., turning the output of the gate driver IC into a Low-level voltage.

The VGH out of the VGH/VGL voltage from the power supply circuit indicates a High-level voltage in a case where the thin film transistors of pixels are in an ON state. Further, the VGL out of the VGH/VGL voltage indicates a Low-level voltage in a case where the thin film transistors of pixels are in an OFF state.

The OE signal input into the gate driver IC relates to only an output control part in the gate driver IC. Further, the VGH/VGL voltage input into the gate driver IC relates to only a level shifter and an output amplifier circuit in the gate driver IC.

Therefore, the OE signal and the VGH/VGL voltage do not affect an STV input/STV output signal that is monitored by the timing controller or monitored by a display system. Here, a start pulse of an STV input signal determines a timing of a first line (OUT 1) of the subject gate driver IC (gate driver IC into which the start pulse is input). Further, the STV output signal is to be a start pulse of the gate driver IC in the next stage. In actuality, signal wiring of an STVD and an STVU is connected to the gate driver IC, and an input and an output are switched by a logic of a vertical scan-switching UD signal. Further, the STV input signal and the STV output signal are also referred collectively as an STV signal.

Therefore, in a case where the OE signal to be input into the gate driver IC and the VGH/VGL voltage to be input into the gate driver IC are not input normally due to disconnection of wiring for transmitting those signals or the like, such a case cannot be detected with the STV input/STV output signal.

In order to detect whether or not each of the OE signal and the VGH/VGL voltage is normally input into the gate driver IC, for example, loopback is carried out from terminals provided in the gate driver IC for cascade connection of the gate driver IC as monitoring wiring of the OE signal and the VGH/VGL voltage.

Specifically, as monitoring wiring of the OE signal, wiring is connected from a terminal for cascade connection in the gate driver IC to the display system via the interface connector. Further, as monitoring wiring of the VGH/VGL voltage, wiring is connected from another terminal for cascade connection in the gate driver IC to a dedicated detection circuit.

In such a manner, whether or not each of the OE signal and the VGH/VGL voltage is normally input into the gate driver IC can be detected.

Note that, a configuration in which driving ICs of a display device are connected in cascade is disclosed in Japanese Patent Application Laid-Open No. 2013-160999, for example.

In a case where the wiring looped back from the terminals provided in the gate driver IC for cascade connection of the gate driver IC is used as the monitoring wiring of the OE signal and the VGH/VGL voltage, the dedicated detection circuit needs to be mounted.

Further, in a case where the wiring looped back from the terminals provided in the gate driver IC for cascade connection of the gate driver IC is used as the monitoring wiring of the OE signal and the VGH/VGL voltage, glass wiring for the loopback further needs to be added as the monitoring wiring of the OE signal and the VGH/VGL voltage. In that case, however, increase in glass size increases the size of a frame of the liquid crystal panel.

SUMMARY

A technology disclosed in the specification of this application relates to a technology for detecting abnormality of a liquid crystal display based on an OE signal, a VGH voltage, and a VGL voltage while preventing increase in the number of wires.

A first aspect of the technology disclosed in the specification of this application is intended for a driver IC including an abnormality detection part, a waveform-changing part, and an output part. The abnormality detection part detects at least one of abnormality of an OE signal being a signal for controlling an output of a gate driver part, abnormality of a VGH being a signal indicating a High-level voltage in a case where a drive transistor in each pixel of a liquid crystal display panel is in an ON state, and abnormality of a VGL being a signal indicating a Low-level voltage in a case where the drive transistor is in an OFF state. The waveform-changing part changes a waveform of an STV signal being a start signal for generating a gate pulse based on a signal output from the abnormality detection part. The output part outputs the STV signal.

According to the first aspect of the technology disclosed in the specification of this application, abnormality of the liquid crystal display can be detected based on the STV signal reflecting at least one of the abnormality of the OE signal, the abnormality of the VGH voltage, and the abnormality of the VGL voltage while preventing increase in the number of wires.

A second aspect of the technology disclosed in the specification of this application is intended for a liquid crystal display device including the above-mentioned driver IC.

According to the second aspect of the technology disclosed in the specification of this application, abnormality of the liquid crystal display can be detected based on the STV signal reflecting at least one of the abnormality of the OE signal, the abnormality of the VGH voltage, and the abnormality of the VGL voltage while preventing increase in the number of wires in the liquid crystal display device.

The object, features, aspects, and advantages relating to the technology disclosed in the specification of this application become more obvious with detailed description given below and the attached drawings.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a view illustrating a case where waveforms of the STV output signal are changed in a plurality of forms according to the preferred embodiment.

FIG. 11 is a circuit diagram schematically illustrating a configuration of an abnormality detection circuit in the gate driver IC according to the preferred embodiment.

FIG. 12 is a circuit diagram schematically illustrating another example of a configuration of the abnormality detection circuit in the gate driver IC according to the preferred embodiment.

FIG. 13 is a view illustrating a case where waveforms of the STV output signal are changed in a plurality of forms when using another logic circuit in FIG. 10.

DESCRIPTION OF THE PREFERRED EMBODIMENTS

Now, preferred embodiments are described with reference to the attached drawings.

Note that, the drawings are schematically illustrated, and configurations are to be omitted or configurations are to be simplified as appropriate for the sake of description. Further, the size and the positional interrelationship of the configurations each illustrated in different drawings or the like are not necessarily to be illustrated accurately, and may be changed as appropriate.

Further, in the description given below, similar components are denoted by the same reference symbols in illustration, and terms and functions thereof are also supposed to be similar thereto. Accordingly, detailed description thereof may be omitted to avoid redundancy.

First Preferred Embodiment

Now, description is given of a driver IC and a liquid crystal display device according to this preferred embodiment. Here, the driver IC includes a driver IC integrating a gate driver IC (gate driver part) and a source driver IC (source driver part).

Figure 1:
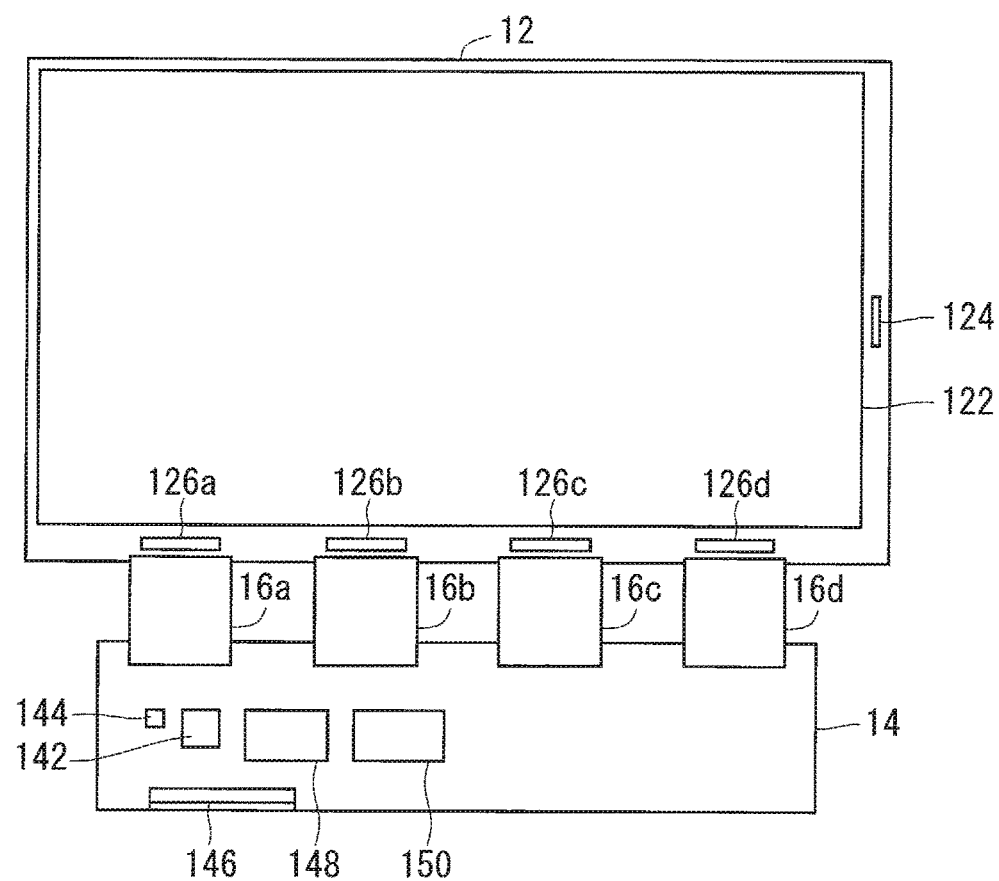
FIG. 1 is a view schematically illustrating a configuration of a liquid crystal display device according to a preferred embodiment.

FIG. 1 is a view schematically illustrating a configuration of a liquid crystal display device according to this preferred embodiment. As illustrated in FIG. 1, the liquid crystal display device includes a liquid crystal panel 12, a circuit board 14, a flexible print circuit board (flexible printed circuits, i.e., FPCs) 16a for connecting the liquid crystal panel 12 and the circuit board 14, a flexible print circuit board 16b for connecting the liquid crystal panel 12 and the circuit board 14, a flexible print circuit board 16c for connecting the liquid crystal panel 12 and the circuit board 14, and a flexible print circuit board 16d for connecting the liquid crystal panel 12 and the circuit board 14.

The liquid crystal panel 12 includes a pixel region 122, a gate driver IC 124 arranged in a vertical axis of a circumferential region of the pixel region 122, and a source driver IC 126a, a source driver IC 126b, a source driver IC 126c, and a source driver IC 126d each arranged in a horizontal axis of the circumferential region of the pixel region 122 (also represented as "S-IC"). The gate driver IC 124 performs ON/OFF control of thin film transistors (i.e., TFTs) of pixels.

The flexible print circuit board 16a connects the liquid crystal panel 12 and the circuit board 14 at a position corresponding to the source driver IC 126a. The flexible print circuit board 16b connects the liquid crystal panel 12 and the circuit board 14 at a position corresponding to the source driver IC 126b. The flexible print circuit board 16c connects the liquid crystal panel 12 and the circuit board 14 at a position corresponding to the source driver IC 126c. The flexible print circuit board 16d connects the liquid crystal panel 12 and the circuit board 14 at a position corresponding to the source driver IC 126d.

The circuit board 14 includes a timing controller (TCON) 142, an E2PROM 144 (also referred to as "EEPROM") to store software information for setting of the timing controller 142, an interface connector 146, a power supply circuit 148, and a generation circuit 150 for a gradation reference voltage.

Four flexible print circuit boards are provided in parallel in FIG. 1, each of which connects the liquid crystal panel 12 and the circuit board 14.

Note that, the number of the source driver ICs and the number of the flexible print circuit boards are not to be limited to those illustrated in FIG. 1.

Among above, for example, sharing of components such as the timing controller 142, the E2PROM 144, the source driver IC 126a, the source driver IC 126b, the source driver IC 126c, the source driver IC 126d, and the gate driver IC 124 has been implemented.

Meanwhile, particularly in a liquid crystal display device to be used for a vehicle, a state of the liquid crystal display has increasingly been monitored by a display system connected to the interface connector 146. Note that, the display system is not illustrated herein.

Figure 2:
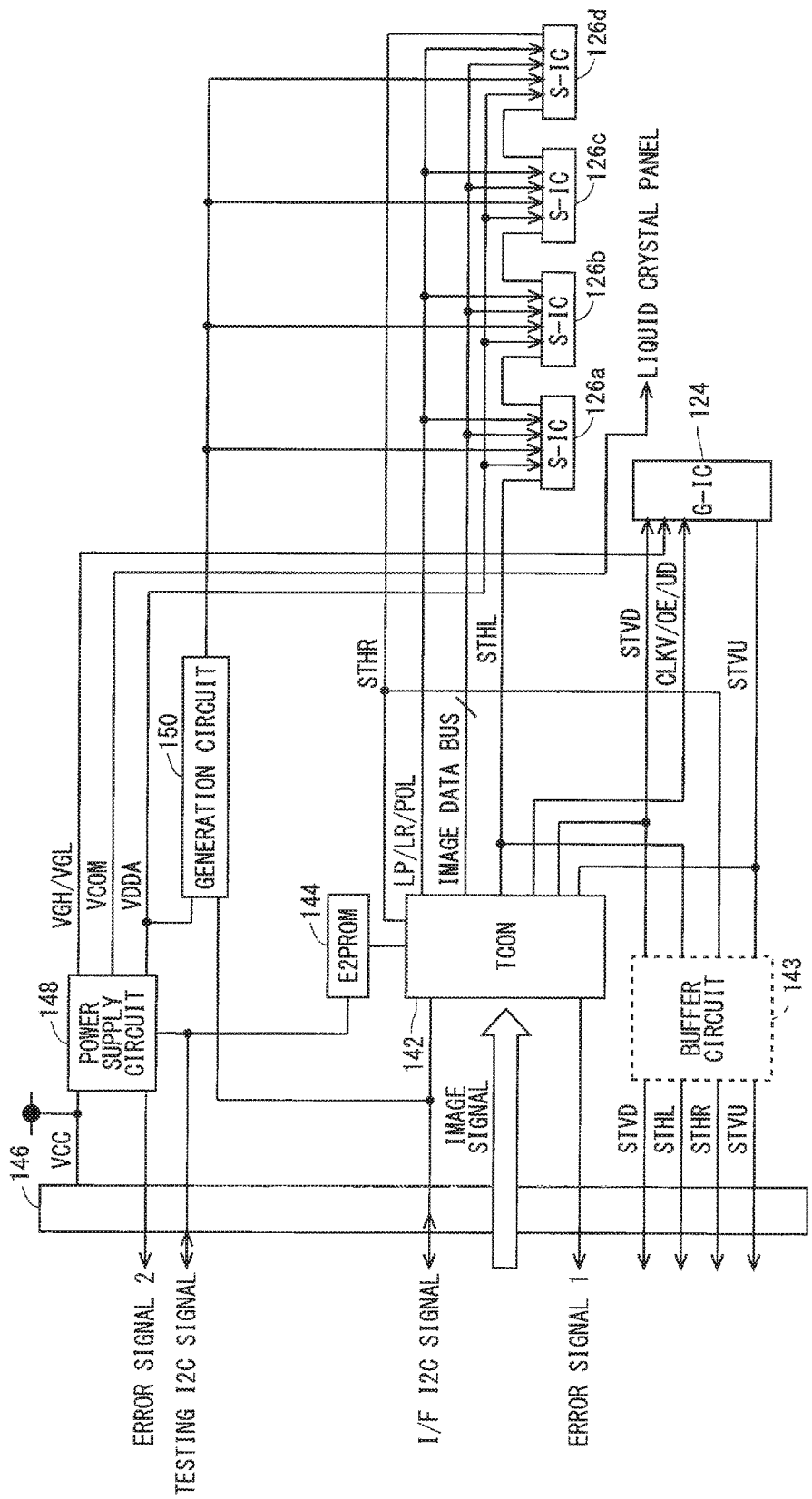
FIG. 2 is a view schematically illustrating a circuit of the liquid crystal display device illustrated in FIG. 1.

FIG. 2 is a view schematically illustrating a circuit of the liquid crystal display device illustrated in FIG. 1. Note that, the circuit diagram illustrated in FIG. 2 is merely an example, and single-ended signaling, mini-LVDS, RSDS, or other methods are assumable as a method of transmitting an image signal. As illustrated in FIG. 2, the power supply circuit 148 supplies power to the source driver IC 126a, the source driver IC 126b, the source driver IC 126c, and the source driver IC 126d. Further, the power supply circuit 148 supplies a reference voltage to the source driver IC 126a, the source driver IC 126b, the source driver IC 126c, and the source driver IC 126d via the generation circuit 150 for a gradation reference voltage.

Further, the power supply circuit 148 outputs a VGH voltage or a VGL voltage to the gate driver IC 124. The VGH voltage output from the power supply circuit 148 is a signal indicating a High-level voltage in a case where the thin film transistors of pixels are in an ON state. Further, the VGL voltage output from the power supply circuit 148 is a signal indicating a Low-level voltage in a case where the thin film transistors of pixels are in an OFF state. In addition, a VDDA is supplied as an analog power source of the source driver IC, and a VCOM is supplied as a common power source of a counter electrode of the liquid crystal panel. In a dot inversion driving method for a general liquid crystal display panel, those four types of power sources are generated and supplied.

An image signal is input into the timing controller 142. Then, the timing controller 142 outputs a horizontal start pulse STH to the source driver IC. Further, the timing controller 142 outputs a vertical start pulse STV to the gate driver IC 124.

Further, the timing controller 142 outputs, to the gate driver IC 124, a shift clock signal (CLKV) of the gate driver IC, an output control (output enable, i.e., OE) signal, and a vertical scan-switching logic signal (UD), and outputs, to all of the source driver ICs, a horizontal scan-switching logic signal (LR), an application-polarity-switching signal of liquid crystals (POL), and a signal for controlling an internal latch and an output timing of the source driver IC (LP) as well as an image data bus (including CLK thereof).

Whether or not the source driver IC operates without problems is monitored on a system side by monitoring a start pulse output by the source driver IC positioned in the final stage of a horizontal scan via the interface connector 146. Along with this, the number of wires and mounted components in the liquid crystal display device is apt to be increased.

Note that, when the start pulse output by the timing controller and the start pulse of the final stage are monitored on the system side via the interface connector 146, a buffer circuit 143 for separation may additionally intermediate.

Further, a system construction has been promoted in consideration of ISO 26262 established in 2011, and risk management has also been required. For example, in a mirror-substitution usage, image retention in the liquid crystal display increases a risk of causing an accident. Therefore, detection of abnormality of the liquid crystal display has been gaining more and more importance. Along with this, the number of monitoring wires and external components mounted in order to detect the abnormality is apt to be increased.

As configuration for recognizing the image retention, for example, the factor is found in a state in which the thin film transistors of pixels are not turned on or not easily turned on, and signals to be input into the gate driver IC 124, i.e., the OE signal from the timing controller 142 and the VGH/VGL voltage from the power supply circuit 148, correspond thereto.

In general, the OE signal output from the timing controller 142 has a function of, under a High-level voltage, disabling, i.e., suspending, the output of the gate driver IC 124.

Figure 3:
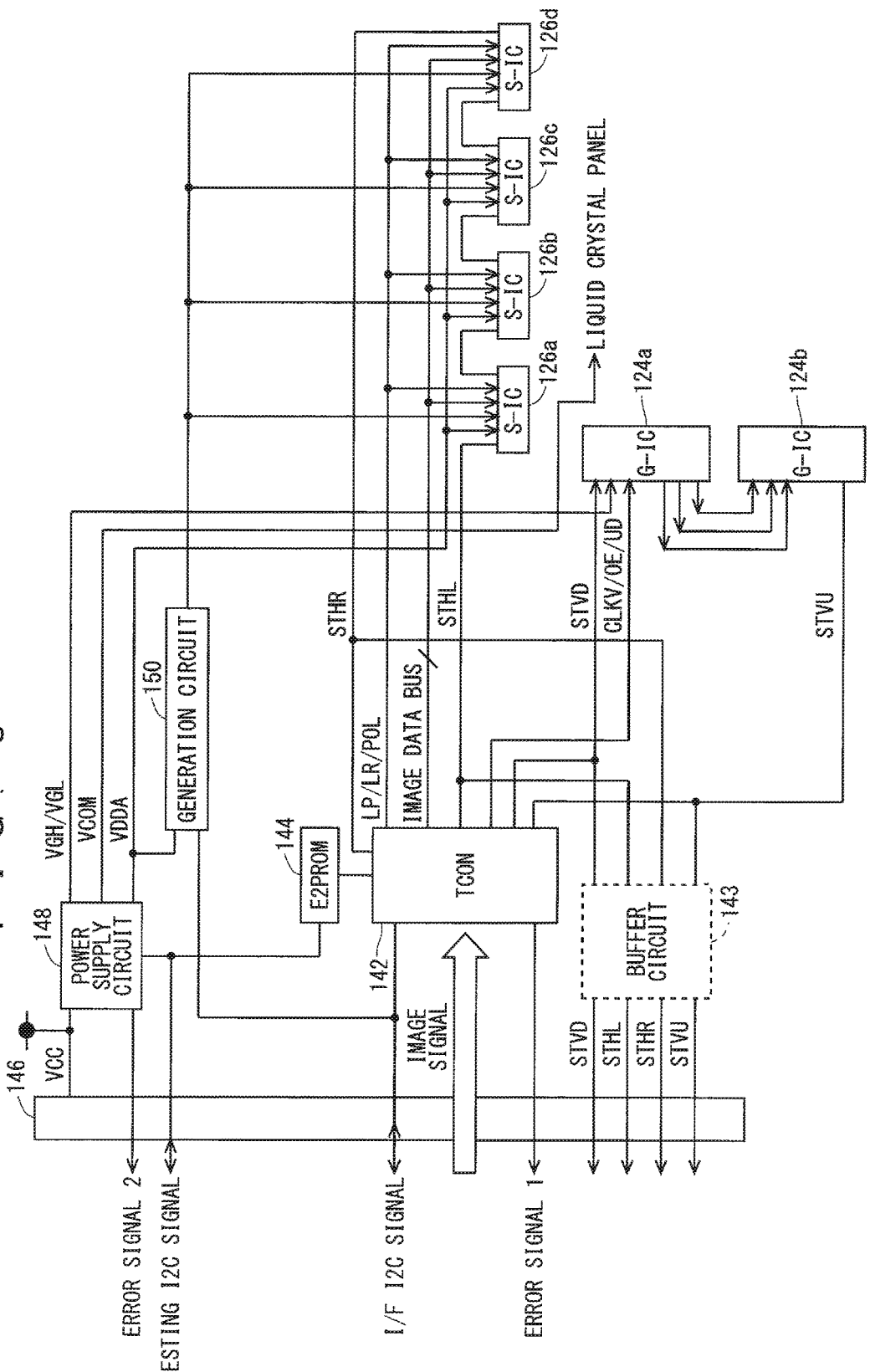
FIG. 3 is a view schematically illustrating another example of a circuit of the liquid crystal display device illustrated in FIG. 1.

FIG. 3 is a view schematically illustrating another example of a circuit of the liquid crystal display device illustrated in FIG. 1. As illustrated in FIG. 3, the power supply circuit 148 supplies power to the source driver IC 126a, the source driver IC 126b, the source driver IC 126c, and the source driver IC 126d.

Further, the power supply circuit 148 outputs the VGH/VGL voltage to a gate driver IC 124a. Then, the VGH/VGL voltage is further output to a gate driver IC 124b. Note that, in a case of an opposite scanning direction, the VGH/VGL voltage is output from the gate driver IC 124b to the gate driver IC 124a.

An image signal is input into the timing controller 142. Then, the timing controller 142 outputs the horizontal start pulse STH to the source driver IC. Further, the timing controller 142 outputs the vertical start pulse STV to the gate driver IC.

Further, the timing controller 142 outputs the shift clock signal of the gate driver IC and the OE signal to the gate driver IC 124a.

Figure 4:
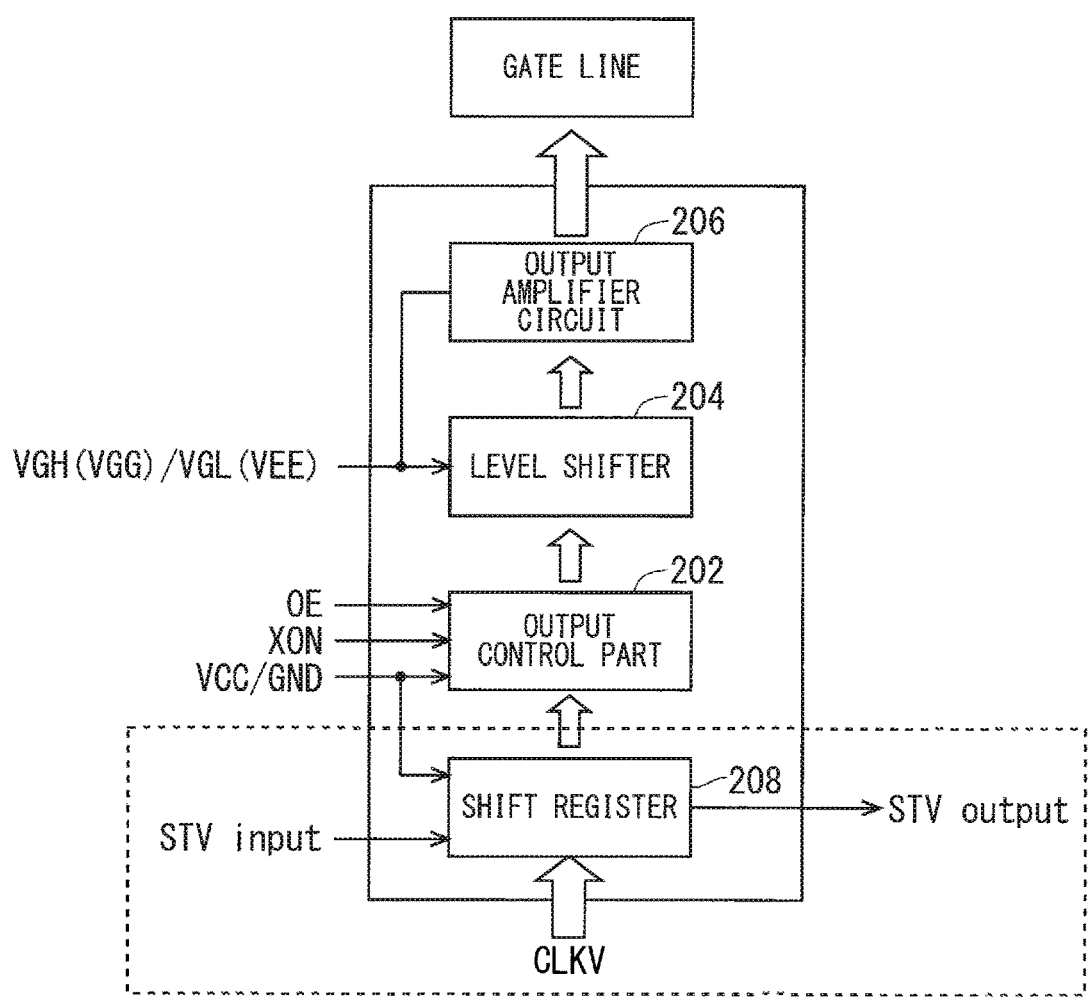
FIG. 4 is a circuit block diagram of a general gate driver IC.

FIG. 4 is a circuit block diagram of a general gate driver IC. As illustrated in FIG. 4, the gate driver IC includes a shift register 208, an output control part 202 into which an output from the shift register 208 is to be input, a level shifter 204 into which an output from the output control part 202 is to be input, and an output amplifier circuit 206 into which an output from the level shifter 204 is to be input.

As illustrated in FIG. 4, an STV input signal, a shift clock signal, and a VCC/GND voltage representing a power supply voltage are input into the shift register 208. Further, an STV output signal is output from the shift register 208.

As illustrated in FIG. 4, the OE signal, an XON signal being a control signal for turning on all of the outputs of the gate driver ICs, and the VCC/GND voltage are input into the output control part 202.

As illustrated in FIG. 4, the VGH/VGL voltage is input into the level shifter 204 and the output amplifier circuit 206.

As illustrated in FIG. 4, the OE signal input into the gate driver IC relates to only the output control part 202 in the gate driver IC. Further, the VGH/VGL voltage input into the gate driver IC relates to only the level shifter 204 and the output amplifier circuit 206 in the gate driver IC.

Therefore, the OE signal and the VGH/VGL voltage do not affect an STV input/STV output signal that is monitored by the timing controller or monitored by a display system, i.e., a signal corresponding to the vertical start pulse STV in FIG. 2. Note that, the STV input/STV output signal and the shift clock signal of the gate driver IC relate to the shift register 208 in the gate driver IC.

Therefore, in a case where the OE signal input into the gate driver IC and the VGH/VGL voltage input into the gate driver IC are not input normally due to disconnection of wiring for transmitting those signals or the like, such a case cannot be detected with the STV input/STV output signal.

Figure 5:
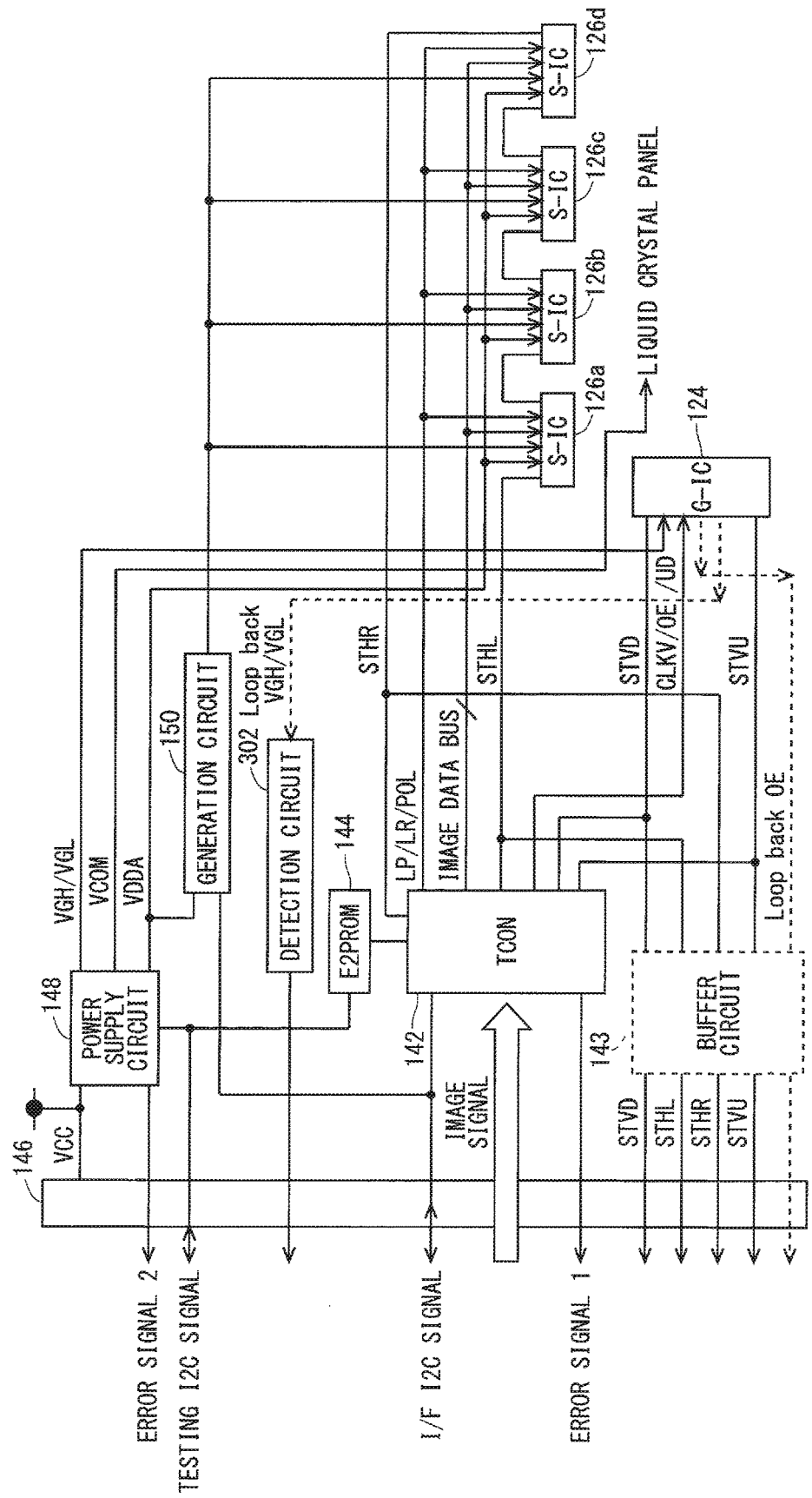
FIG. 5 is a view schematically illustrating yet another example of a circuit of the liquid crystal display device illustrated in FIG. 1.

FIG. 5 is a view schematically illustrating yet another example of a circuit of the liquid crystal display device illustrated in FIG. 1. As illustrated in FIG. 5, in order to detect whether or not each of the OE signal and the VGH/VGL voltage is normally input into the gate driver IC 124, for example, loopback needs to be carried out from terminals provided in the gate driver IC 124 for cascade connection of the gate driver IC 124 as monitoring wiring of the OE signal and the VGH/VGL voltage.

Specifically, as monitoring wiring of the OE signal, wiring is connected from a terminal for cascade connection in the gate driver IC 124 to the display system via the interface connector 146. Further, as monitoring wiring of the VGH/VGL voltage, wiring is connected from another terminal for cascade connection in the gate driver IC 124 to a dedicated detection circuit 302.

In such a manner, whether or not each of the OE signal and the VGH/VGL voltage is normally input into the gate driver IC 124 can be detected.

Figure 6:
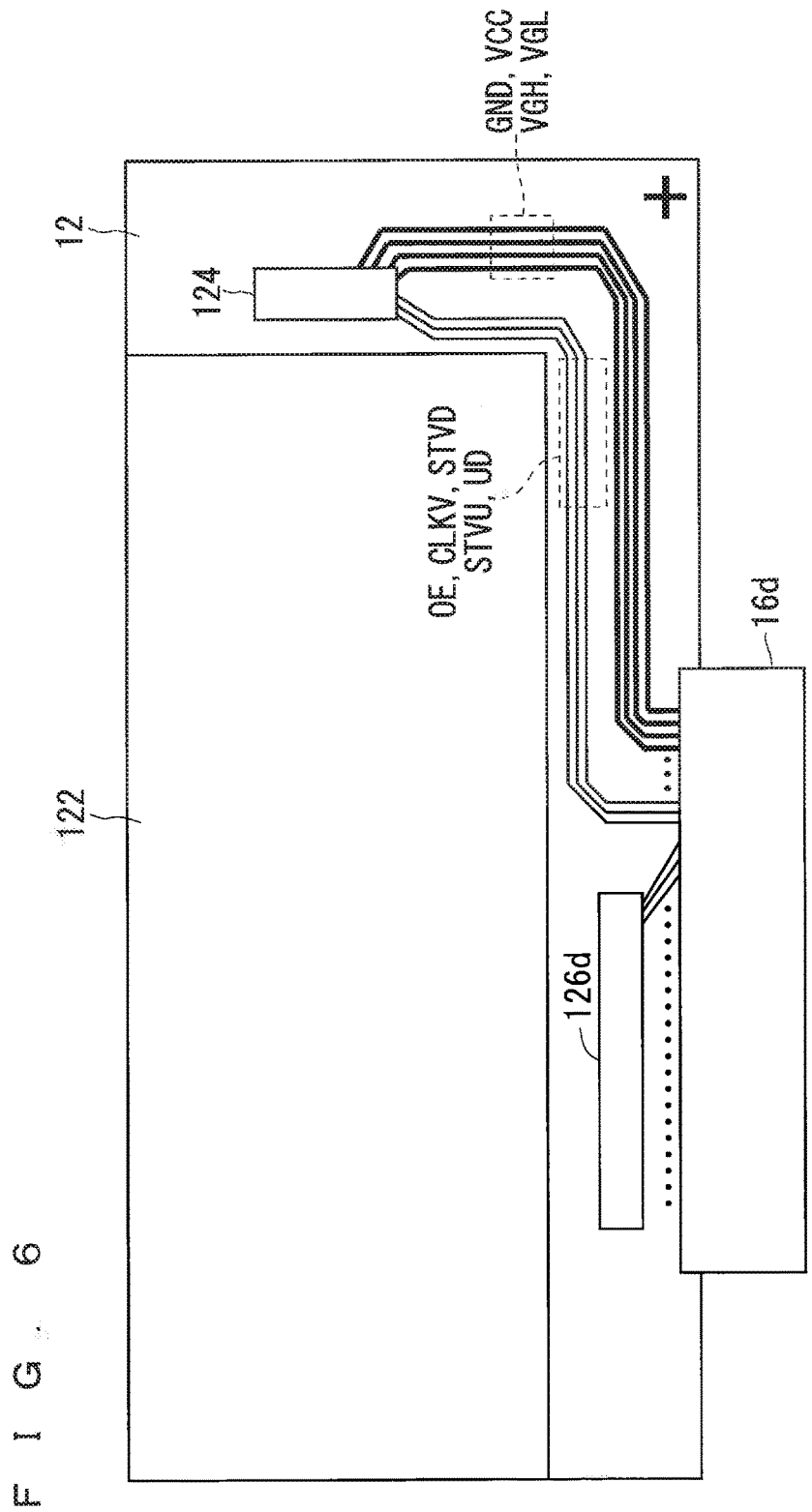
FIG. 6 is a view illustrating a wiring state of the circuit illustrated in FIG. 2.
Figure 7:
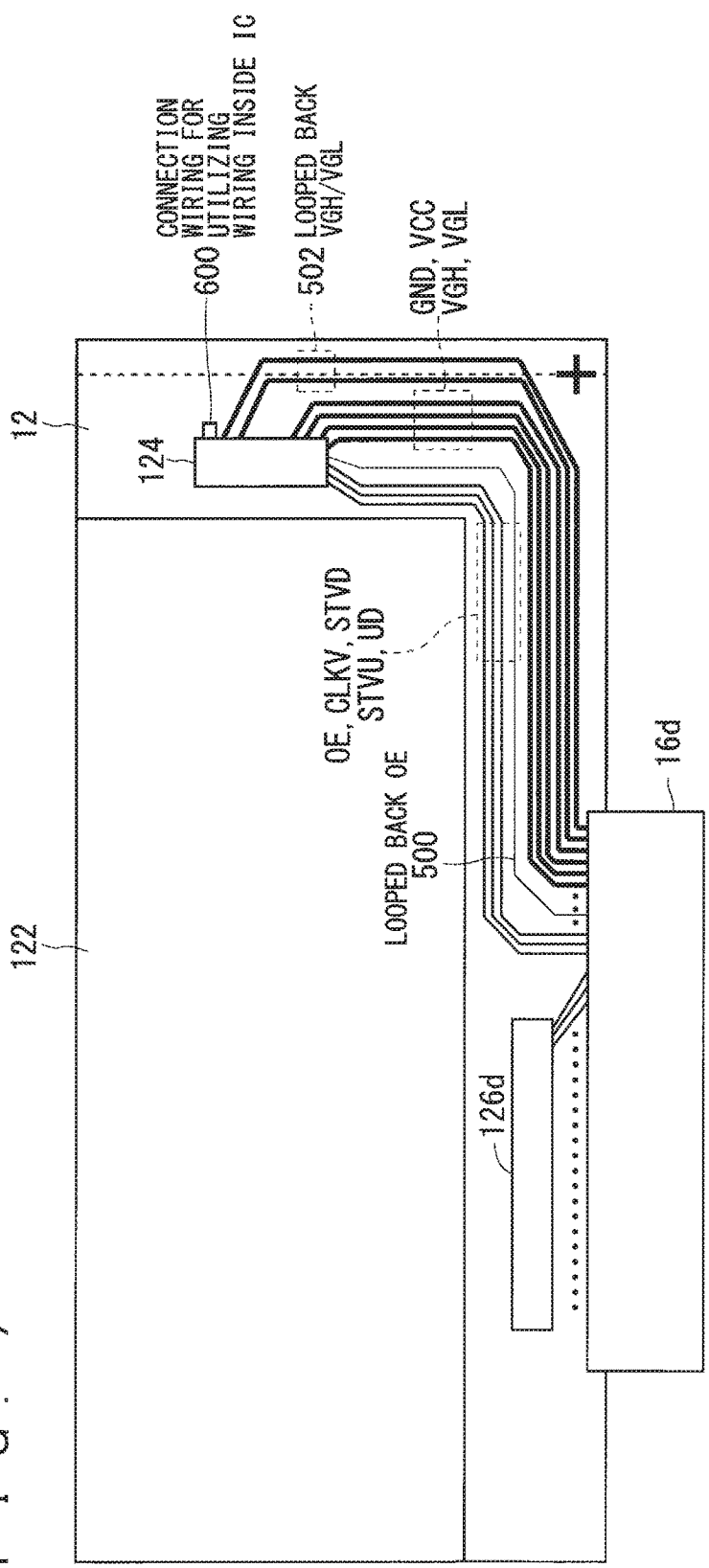
FIG. 7 is a view illustrating a wiring state in a case of utilizing PATH wiring inside a gate IC in the circuit illustrated in FIG. 5.

FIG. 6 is a view illustrating a wiring state of the circuit illustrated in FIG. 2. Further, FIG. 7 is a view illustrating a wiring state in a case of utilizing PATH wiring inside a gate IC in the circuit illustrated in FIG. 5. Further, FIG. 8 is a view illustrating a wiring state in a case without PATH wiring inside a gate IC in the circuit illustrated in FIG. 5.

As illustrated in FIG. 7, in a case where loopback is carried out from the terminals provided in the gate driver IC 124 for cascade connection of the gate driver IC 124 as the monitoring wiring of the OE signal and the VGH/VGL voltage, a looped back OE 500 and a looped back VGH/VGL 502 are added to the case illustrated in FIG. 6. Therefore, glass wiring for the loopback further needs to be added as the monitoring wiring of the OE signal and the VGH/VGL voltage as compared to the case illustrated in FIG. 6. In that case, however, increase in glass size increases the size of a frame of the liquid crystal panel. Note that, connection wiring 600 for utilizing wiring inside an IC in FIG. 7 is connection wiring for diverting the wiring inside the gate driver IC as wiring for loopback.

Figure 8:
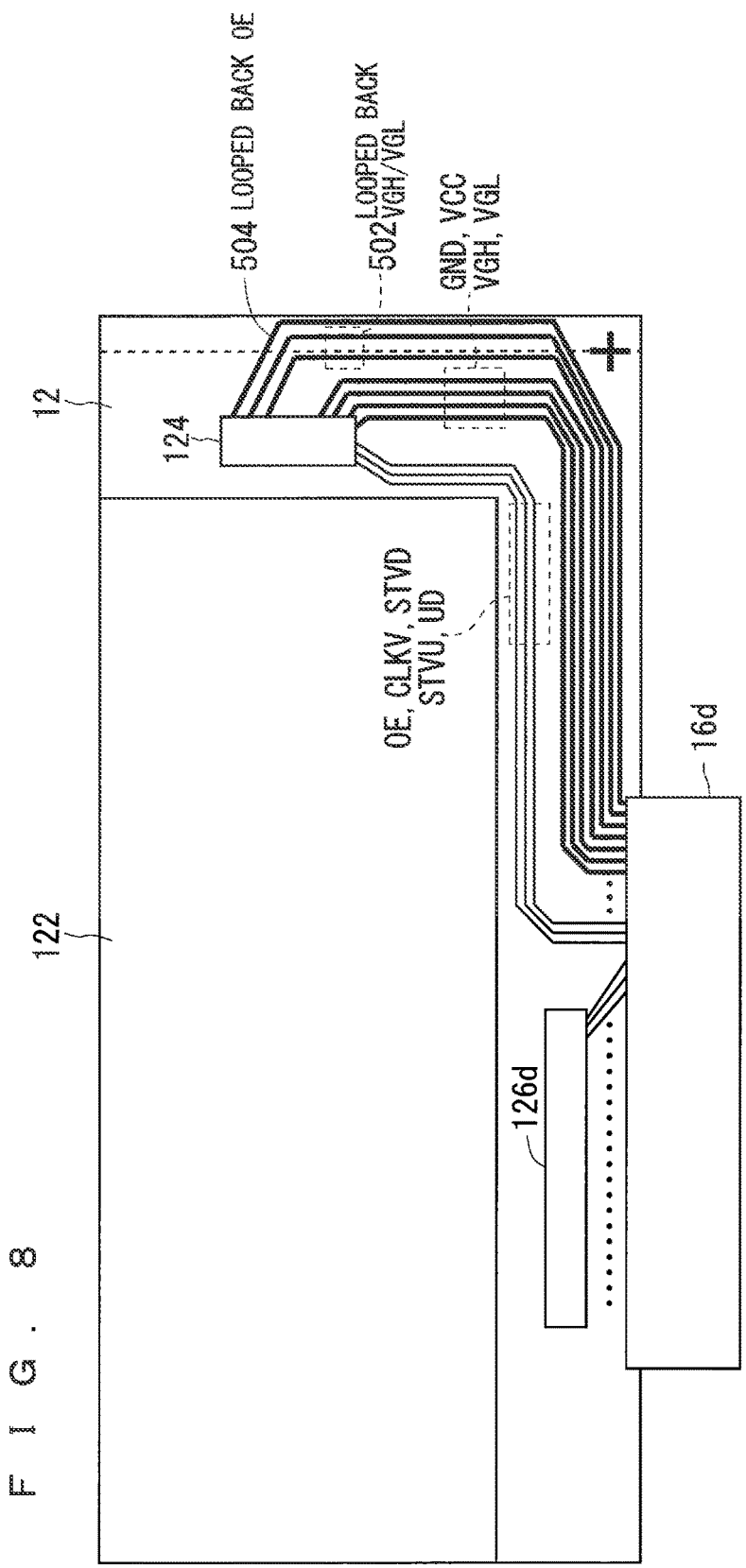
FIG. 8 is a view illustrating a wiring state in a case without PATH wiring inside the gate IC in the circuit illustrated in FIG. 5.

Further, as illustrated in FIG. 8, in a case where loopback is carried out from the terminals provided in the gate driver IC 124 for cascade connection of the gate driver IC 124 as the monitoring wiring of the OE signal and the VGH/VGL voltage, the looped back VGH/VGL 502 and a looped back OE 504 are added to the case illustrated in FIG. 6. Therefore, glass wiring for the loopback further needs to be added as the monitoring wiring of the OE signal and the VGH/VGL voltage as compared to the case illustrated in FIG. 6. In that case, however, increase in glass size increases the size of a frame of the liquid crystal panel.

Further, as illustrated in FIG. 5, in a case where loopback is carried out from the terminals provided in the gate driver IC 124 for cascade connection of the gate driver IC 124 as the monitoring wiring of the OE signal and the VGH/VGL voltage, the dedicated detection circuit 302 also needs to be mounted.

Meanwhile, the STV input/STV output signal is monitored by the timing controller. Further, the STV input/STV output signal is monitored by the display system via the interface connector.

Accordingly, on condition that abnormality of the OE signal, abnormality of the VGH, or abnormality of the VGL can affect the STV input/STV output signal, an abnormal state of the gate driver IC 124 can be detected in the timing controller or the display system without increasing the number of signals.

Now, description is given of a liquid crystal display device or a liquid crystal driving device having a configuration so as to reflect the abnormality of the OE signal, the abnormality of the VGH, or the abnormality of the VGL in a waveform itself of the STV output.

Figure 9:
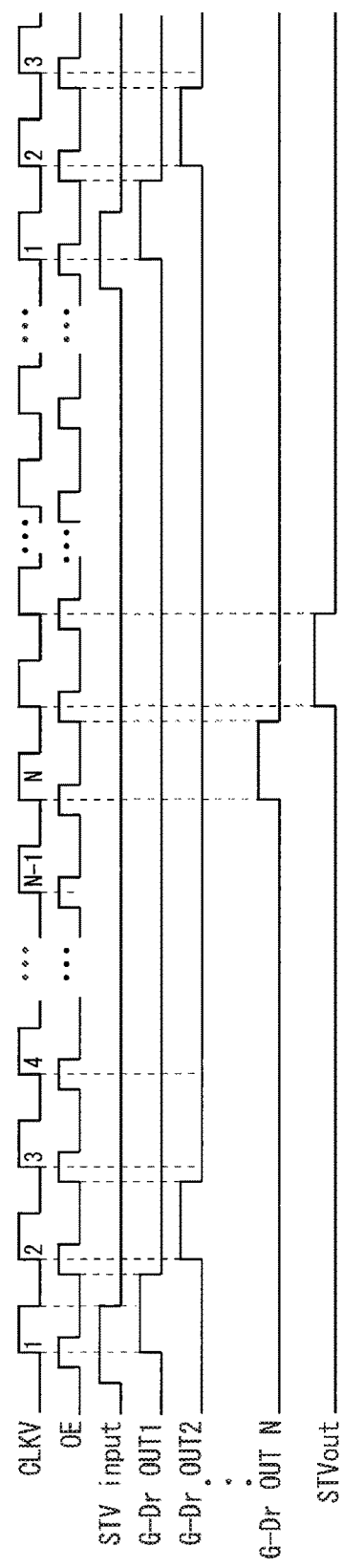
FIG. 9 is a view illustrating general waveforms of a shift clock signal (CLKV) of the gate driver IC, an OE signal, an STV input signal, an output of each gate driver IC, and an STV output signal.

FIG. 9 is a view illustrating waveforms of the shift clock signal (CLKV) of the gate driver IC, the OE signal, the STV input signal, the output of each gate driver IC, and the STV output signal. Note that, in FIG. 9, the number of outputs of the gate driver IC is represented as N.

On the other hand, FIG. 10 is a view illustrating a plurality of types of waveform shapes at the time of abnormality. FIG. 10 illustrates waveforms of the shift clock signal of the gate driver IC, the OE signal, an output signal of an AND circuit to be described later, the STV input signal, the output of each gate driver IC, and the STV output signal. Note that, in FIG. 10, the number of outputs of the gate driver IC is represented as N.

In a case where the OE signal is fixed to be a High-level voltage as an OE signal (x) illustrated in FIG. 10, an AND signal has the same waveform that toggles in phase with the shift clock signal as in an AND signal (x).

In a case where the OE signal is fixed to be a Low-level voltage as an OE signal (y) illustrated in FIG. 10, the AND signal is not output as an AND signal (y).

FIG. 10 illustrates a case where the STV output signal is fixed to be a Low-level voltage to have no pulse itself as an STV output (a), a case where the STV output signal is repeated to set a plurality of pulses as an STV output (b), and a case where the STV output signal is fixed to be a High-level voltage as an STV output (c).

In a case where the OE signal falls in such an abnormal state as the OE signal (x) or the OE signal (y), the waveform itself of the STV output signal is changed as the above-mentioned STV output (a), STV output (b), or STV output (c). In such a manner, the abnormality of the OE signal, the abnormality of the VGH, or the abnormality of the VGL is reflected in the waveform of the STY output signal.

Figure 17:
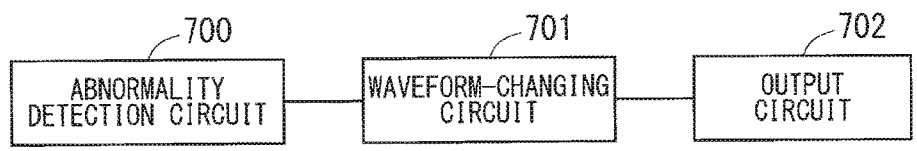
FIG. 17 is a view conceptionally illustrating a configuration in relation to the waveform change of the STV signal of the gate driver according to the preferred embodiment.

FIG. 17 is a view conceptually illustrating a configuration in relation to the waveform change of the STY signal of the gate driver IC according to this preferred embodiment.

As illustrated in FIG. 17, the gate driver IC according to this preferred embodiment includes an abnormality detection circuit 700 for detecting at least one of abnormality of the OE signal, abnormality of the VGH, and abnormality of the VGL, a waveform-changing circuit 701 for changing the waveform of the STV signal based on a signal output from the abnormality detection circuit 700, and an output circuit 702 for outputting the STV signal.

The STV output signal reflecting the abnormality of the OE signal, the abnormality of the VGH, or the abnormality of the VGL is generated in the waveform-changing circuit 701 based on the output from the abnormality detection circuit 700. That is, in a case where a signal is output from the abnormality detection circuit 700, the waveform-changing circuit 701 changes the STV signal as the STV output (a) illustrated in FIG. 10, the STV output (b) illustrated in FIG. 10, or the STV output (c) illustrated in FIG. 10, for example. An abnormality detection signal of the STV output (a), the STV output (b), or the STV output (c) is monitored by the TCON or the system side. Designing conditions of the TCON or the system determine which of the STV output (a), the STV output (b), and the STV output (c) is to be used. A signal easy to recognize abnormality is selected.

The abnormality detection circuit 700 includes a determination circuit arranged in a path through which the OE signal of the gate driver IC is input, and a comparator circuit arranged in a path through which the VGH/VGL voltage of the gate driver IC is input.

<Configuration of Abnormality Detection Circuit>

FIG. 11 is a circuit diagram schematically illustrating a configuration of the abnormality detection circuit in the gate driver IC according to this preferred embodiment. As illustrated in FIG. 11, the abnormality detection circuit includes an OE-signal determination part 22 and a VGH/VGL determination part 26.

The OE-signal determination part 22 includes an AND circuit 220 being a logic integrated circuit into which the OE signal and the shift clock signal are to be input, and a determination circuit 222 into which a branch signal of the above-mentioned shift clock signal and an output signal of the AND circuit 220 are to be input.

In the OE-signal determination part 22, such a case is normal that the output signal of the AND circuit 220 has a shorter pulse width than a pulse width of an input OE signal as illustrated in FIG. 10.

However, in a case where the input OE signal is fixed to be a High-level voltage, the output signal of the AND circuit 220 has the same pulse width as the shift clock signal.

Accordingly, when determination is made whether or not the output of the AND circuit 220 and the shift clock signal are equal to each other in the determination circuit 222, a state in which the OE signal is fixed to be a High-level voltage, i.e., an abnormal state of the OE signal, can be determined based on a time length in which such an output and a signal are determined to be equal to each other. Then, in a case where the OE signal is in an abnormal state, the determination circuit 222 outputs a signal.

The VGH/VGL determination part 26 includes a comparator circuit 260 in which a reference voltage V1 is set, and a comparator circuit 262 in which a reference voltage V2 is set.

The VGH is input into the comparator circuit 260. Then, in a case where the VGH is equal to or lower than the reference voltage V1, i.e., in a case where an absolute value of the VGH is smaller than an absolute value of the reference voltage V1, the comparator circuit 260 outputs a signal determining that the VGH is in an abnormal state.

The VGL generally being a negative voltage is input into the comparator circuit 262. Then, in a case where the VGL is equal to or higher than the reference voltage V2, i.e., in a case where an absolute value of the VGL is smaller than an absolute value of the reference voltage V2, the comparator circuit 262 outputs a signal determining that the VGL is in an abnormal state.

The output signal of the OE-signal determination part 22 and the output signal of the VGH/VGL determination part 26 are input into an OR circuit 28. Then, the OR circuit 28 outputs a signal in a case where an output signal of the determination circuit 222 indicating an abnormal state of the OE signal, an output signal of the comparator circuit 260 indicating an abnormal state of the VGH, or an output signal of the comparator circuit 262 indicating an abnormal state of the VGL is input.

In a case where a signal is output from the OR circuit 28, the waveform-changing circuit 701 changes the waveform itself of the STV output signal. As forms of the waveform changes of the STV output signal, there are a form in which the STY output signal has no pulse itself, a form in which a plurality of pulses of the STV output signal are set, and a form in which the pulse of the STV output signal is constantly maintained to be a High-level voltage, for example.

Here, the reference voltage V1 can be changed by an external resistor attached in a wiring path that is input to the comparator circuit 260. In such a manner, determination criteria in the comparator circuit 260 can be adjusted.

Further, the reference voltage V2 can also be changed by an external resistor attached in a wiring path that is input to the comparator circuit 262. In such a manner, determination criteria in the comparator circuit 262 can be adjusted.

FIG. 12 is a circuit diagram schematically illustrating another example of a configuration of the abnormality detection circuit in the gate driver IC according to this preferred embodiment. As illustrated in FIG. 12, the abnormality detection circuit includes an OE-signal determination part 24 and the VGH/VGL determination part 26.

The OE-signal determination part 24 includes an XOR circuit 240 being an exclusive OR circuit into which the OE signal and the shift clock signal are to be input, and a determination circuit 242 into which the branch signal of the shift clock signal input into the XOR circuit 240 and an output signal of the XOR circuit 240 are to be input.

FIG. 13 is a view illustrating a case where waveforms of the STV output signal are changed in a plurality of forms according to this preferred embodiment. FIG. 13 illustrates waveforms of the shift clock signal of the gate driver IC, the OE signal, the output signal of the XOR circuit 240, the STV input signal, the output of each gate driver IC, and the STV output signal. Note that, in FIG. 13, the number of outputs of the gate driver IC is represented as N.

In a case where the OE signal is fixed to be a High-level voltage as the OE signal (x) illustrated in FIG. 13, an XOR signal has an inverted waveform of the shift clock signal as an XOR signal (x).

In a case where the OE signal is fixed to be a Low-level voltage as the OE signal (y) illustrated in FIG. 13, the XOR signal has the same waveform as the shift clock signal as an XOR signal (y).

FIG. 13 illustrates a case where the STV output signal is fixed to be a Low-level voltage to have no pulse itself as the STV output (a), a case where the STV output signal is repeated to set a plurality of pulses as the STV output (b), and a case where the STV output signal is fixed to be a High-level voltage as the STV output (c).

In the OE-signal determination part 24, such a case is normal that the output signal of the XOR circuit 240 has a waveform in which a pulse width is added in one horizontal period as illustrated in FIG. 13.

However, in a case where an input OE signal is fixed to be a High-level voltage, the output signal of the XOR circuit 240 has an inverted waveform of the shift clock signal. On the other hand, in a case where the OE signal is fixed to be a Low-level voltage, the output signal of the XOR circuit 240 has the same waveform as the shift clock signal.

Accordingly, when determination is made whether or not the output of the XOR circuit 240 and the shift clock signal are equal to each other in the determination circuit 242, an abnormal state of the OE signal can be determined based on a time length in which such an output and a signal are determined to be equal to each other. Then, in a case where the OE signal is in an abnormal state, the determination circuit 242 outputs a signal.

The VGH/VGL determination part 26 includes the comparator circuit 260 in which the reference voltage V1 is set, and the comparator circuit 262 in which the reference voltage V2 is set.

An output signal of the OE-signal determination part 24 and an output signal of the VGH/VGL determination part 26 are input into the OR circuit 28. Then, the OR circuit 28 outputs a signal in a case where an output signal of the determination circuit 242 indicating an abnormal state of the OE signal, an output signal of the comparator circuit 260 indicating an abnormal state of the VGH, or an output signal of the comparator circuit 262 indicating an abnormal state of the VGL is input.

In a case where a signal is output from the OR circuit 28, the waveform-changing circuit 701 changes the waveform itself of the STV output signal. As forms of the waveform changes of the STV output signal, there are a form in which the STV output signal has no pulse itself, a form in which a plurality of pulses of the STV output signal are set, and a form in which the pulse of the STV output signal is constantly maintained to be a High-level voltage, for example.

In the case of the AND circuit 220, only a state in which the OE signal is fixed to be a High-level voltage is determined. In the case of the XOR circuit 240, however, in addition thereto, a state in which the OE signal is fixed to be a Low-level voltage can also be determined.

Second Preferred Embodiment

Description is given of a gate driver IC and a liquid crystal display device according to this preferred embodiment. In the description given below, components similar to the components described in the above preferred embodiment are denoted by the same reference symbols in illustration, and detailed description thereof is omitted as appropriate.

<Configuration of Abnormality Detection Circuit>

As an input to the comparator circuit in the VGH/VGL determination part, an output signal of the gate driver IC 124 can be diverted.

Figure 14:
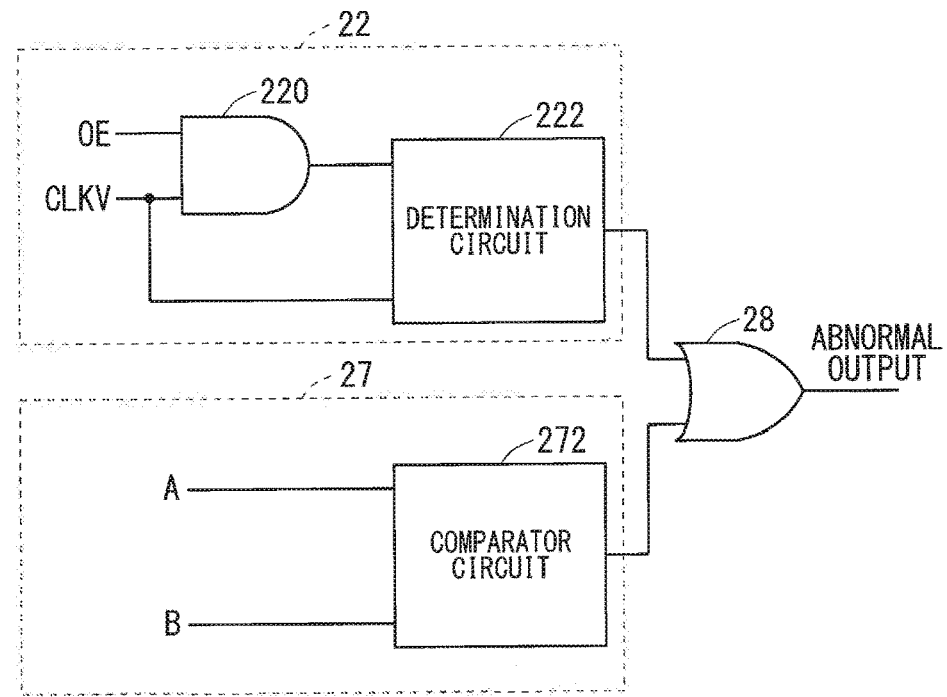
FIG. 14 is a circuit diagram schematically illustrating a configuration of the abnormality detection circuit in the gate driver IC according to another preferred embodiment.

FIG. 14 is a circuit diagram schematically illustrating a configuration of the abnormality detection circuit in the gate driver IC according to this preferred embodiment. As illustrated in FIG. 14, the abnormality detection circuit includes the OE-signal determination part 22 and a VGH/VGL determination part 27.

Figure 15:
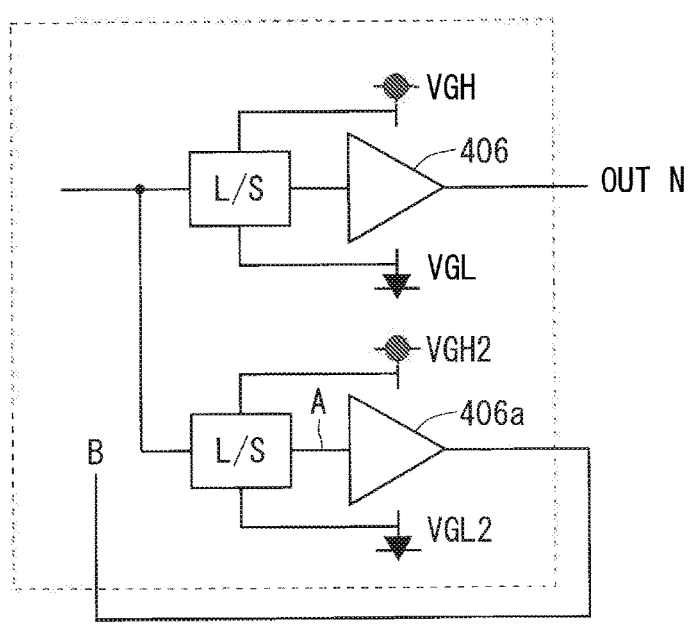
FIG. 15 is a view illustrating a configuration of the gate driver IC corresponding to the abnormality detection circuit illustrated in FIG. 14.

Further, FIG. 15 is a view illustrating a configuration of the gate driver IC corresponding to the abnormality detection circuit illustrated in FIG. 14. In FIG. 15, L/S corresponds to a level shifter.

As illustrated in FIG. 15, the gate driver IC includes an output amplifier circuit 406 into which a signal is to be input (first output amplifier circuit), and a dummy circuit 406a which is connected to the output amplifier circuit 406 in parallel and into which a branch signal of the above-mentioned signal is to be input (second output amplifier circuit). A structure of the dummy circuit 406a is similar to the structure of the output amplifier circuit 406. However, a power source of the dummy circuit 406a is set to be a VGH2/VGL2 voltage as illustrated in FIG. 15, which is wired in a different system from the VGH/VGL voltage of the output amplifier circuit 406.

Then, an output signal of the dummy circuit 406a is again input into the gate driver IC via panel wiring, and is input into a comparator circuit 272 in FIG. 14. This corresponds to "B" in FIG. 14 and FIG. 15.

On the other hand, a signal to be input into the output amplifier circuit 406, i.e., an output signal in the final stage inside the gate driver IC, is also input into the comparator circuit 272. This corresponds to "A" in FIG. 14 and FIG. 15.

In a case where the VGH/VGL voltage is not input into the gate driver IC, the comparator circuit 272 cannot compare the output signal of the dummy circuit 406*a* and the output signal (OUT N) in the final stage inside the gate driver IC in the first place. Therefore, in such a case, the comparator circuit 272 outputs a signal determining that the VGH/VGL voltage is in an abnormal state.

On the other hand, in a case where the output signal of the dummy circuit 406*a* and the output signal in the final stage inside the gate driver IC are equal to each other, the comparator circuit 272 does not output a signal determining that the VGH/VGL voltage is normal. The comparator circuit 272 makes a judgement of a threshold value with a differential amplifier, a low-pass filter (integrating) circuit, and a comparator, for example. In a case where the VGH/VGL voltage is abnormal, a waveform of the A signal and a waveform of the B signal become significantly different, resulting in outputting a square wave from a differential amplifier. This waveform is converted into a direct current by the low-pass filter circuit, and a judgement is made to be abnormal for a predetermined value or more by the comparator. In a case where the VGH/VGL voltage is normal, the output of the comparator circuit 272 is approximately the amount corresponding to a delay made by the dummy circuit 406*a*, and is removed by the low-pass filter circuit.

A signal branched from a final output of the liquid crystal panel is not used as a signal to be input into the comparator circuit 272 herein in view of preventing influence of a load of the pixels.

<Configuration of Abnormality Detection Circuit>

A combination of the OE-signal determination part and the VGH/VGL voltage determination part may be a combination different from the combination illustrated in the first preferred embodiment and the second preferred embodiment.

Figure 16:
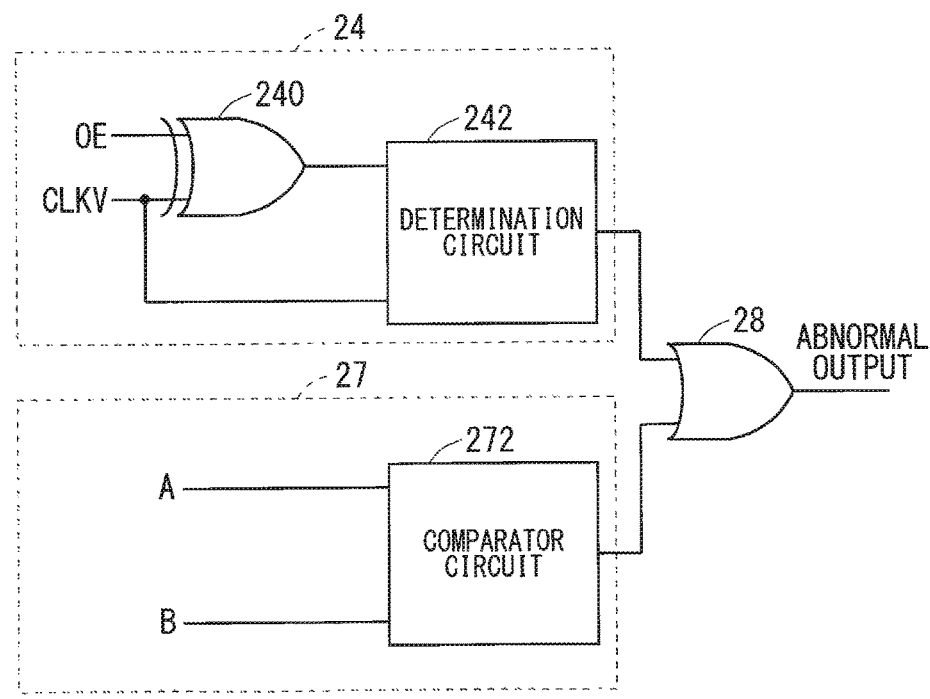
FIG. 16 is a circuit diagram schematically illustrating a configuration of the abnormality detection circuit in the gate driver IC according to the preferred embodiment.

FIG. 16 is a circuit diagram schematically illustrating a configuration of the abnormality detection circuit in the gate driver IC according to this preferred embodiment. The abnormality detection circuit is arranged inside the gate driver IC. As illustrated in FIG. 16, the abnormality detection circuit includes the OE-signal determination part 24 and the VGH/VGL determination part 27.

The OE-signal determination part 24 includes the XOR circuit 240 being an exclusive OR circuit, and the determination circuit 242 into which a branch signal of the shift clock signal input into the XOR circuit 240 and the output signal of the XOR circuit 240 are to be input.

The VGH/VGL determination part 27 includes the comparator circuit 272 into which the output signal of the dummy circuit 406*a* and the output signal in the final stage inside the gate driver IC are to be input.

Figure 18:
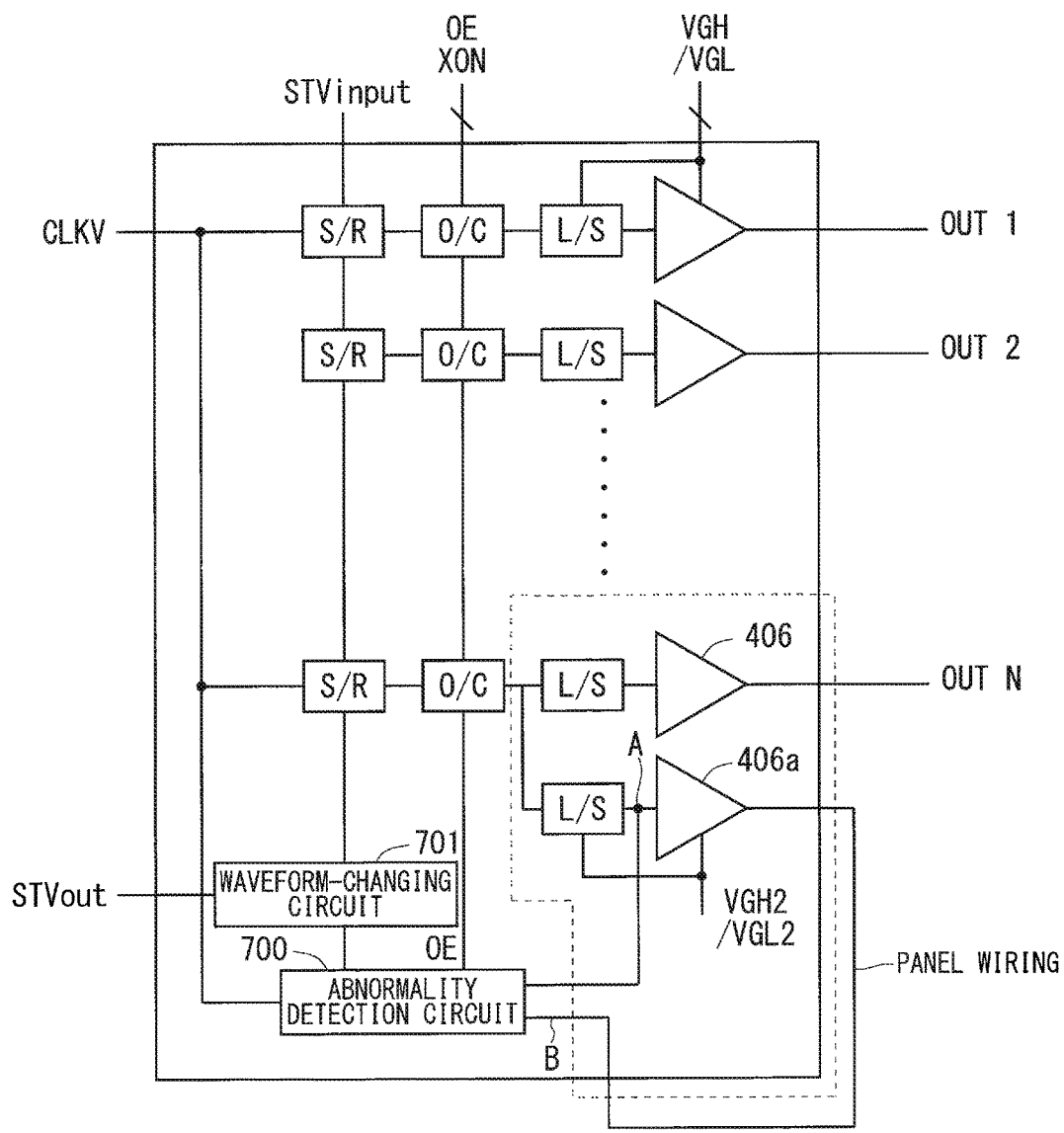
FIG. 18 is a circuit diagram illustrating a configuration in which the abnormality detection circuit and a waveform-changing circuit are arranged according to the preferred embodiment.

FIG. 18 is a circuit diagram illustrating a configuration in which the abnormality detection circuit 700 and the waveform-changing circuit 701 are arranged according to this preferred embodiment. In FIG. 18, SIR corresponds to a shift register, O/C to an output control part, and L/S to a level shifter, respectively. As illustrated in FIG. 18, the waveform-changing circuit 701 is arranged inside the gate driver IC. The waveform-changing circuit 701 is arranged in such a mode as to be added to a circuit structure of the gate driver IC.

Figure 19:
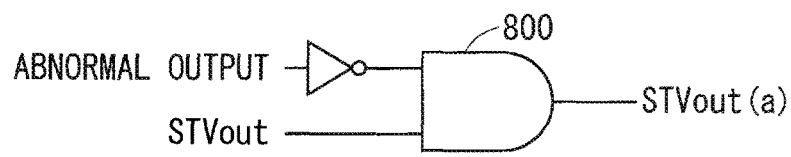
FIG. 19 is a circuit diagram illustrating a specific circuit structure of the waveform-changing circuit according to the preferred embodiment.

FIG. 19 is a circuit diagram illustrating a specific circuit structure of the waveform-changing circuit according to this preferred embodiment. As illustrated in FIG. 19, the waveform-changing circuit includes an AND circuit 800 into which an abnormal output and the STV output are to be input, and outputs the STV output (a).

Figure 20:
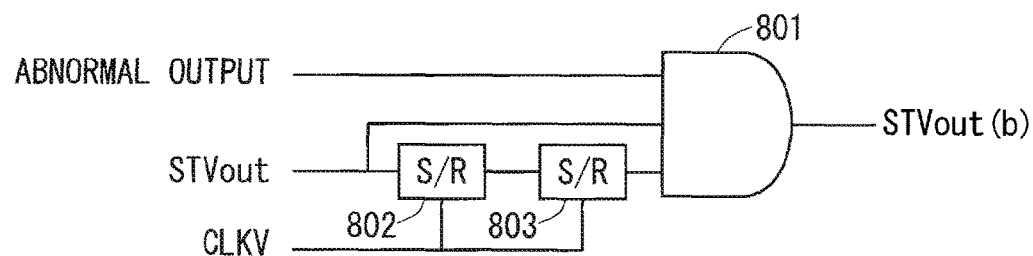
FIG. 20 is a circuit diagram illustrating a specific circuit structure of the waveform-changing circuit according to the preferred embodiment.

FIG. 20 is a circuit diagram illustrating a specific circuit structure of the waveform-changing circuit according to this preferred embodiment. As illustrated in FIG. 20, the waveform-changing circuit includes an AND circuit 801 into which an abnormal output, an STV output, and an output of a shift register 803 are to be input, and outputs the STV output (b).

Here, the shift clock signal and an output of a shift register 802 are input into the shift register 803. Further, the shift clock signal and the STV output are input into the shift register 802.

Figure 21:
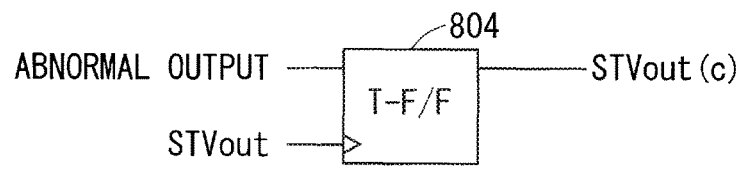
FIG. 21 is a circuit diagram illustrating a specific circuit structure of the waveform-changing circuit according to the preferred embodiment.

FIG. 21 is a circuit diagram illustrating a specific circuit structure of the waveform-changing circuit according to this preferred embodiment. As illustrated in FIG. 21, the waveform-changing circuit includes a T flip-flop circuit 804 into which an abnormal output and an STV output are to be input, and outputs the STV output (c).

<Effects to be Generated by Preferred Embodiments Described Above>

Next, effects to be generated by the preferred embodiments described above are illustrated. Note that, in the description given below, the effects are to be described based on the specific configuration illustrated in the preferred embodiments described above, but the specific configuration may be replaced with another specific configuration illustrated in the specification of this application insofar as the configuration generates similar effects.

Further, the replacement may be carried out beyond a plurality of preferred embodiments. That is, such a case is also allowable that configurations illustrated in different preferred embodiments are combined to generate similar effects.

According to the preferred embodiments described above, the driver IC includes an abnormality detection part, a waveform-changing part, and an output part. The abnormality detection part detects at least one of abnormality of the OE signal being a signal for controlling an output of a gate driver part, abnormality of the VGH being a signal indicating a High-level voltage in a case where a drive transistor in each pixel of the liquid crystal display panel is in an ON state, and abnormality of the VGL being a signal indicating a Low-level voltage in a case where the drive transistor is in an OFF state. The waveform-changing part changes a waveform of the STV signal being a start signal for generating a gate pulse based on a signal output from the abnormality detection part. The output part outputs the STV signal. Here, the abnormality detection part corresponds to the abnormality detection circuit 700, for example. Further, the waveform-changing part corresponds to the waveform-changing circuit 701, for example. Further, the output part corresponds to the output circuit 702, for example.

According to such a configuration, abnormality of the liquid crystal display can be detected based on the STV signal reflecting at least one of the abnormality of the OE signal, the abnormality of the VGH voltage, and the abnormality of the VGL voltage while preventing increase in the number of wires. Specifically, in a case where a signal is output from the abnormality detection circuit 700, the waveform-changing circuit 701 changes the STV signal. Then, the changed STV signal is received by the timing controller 142 or the display system, thereby detecting abnormality of the liquid crystal display. The STV signal is a signal monitored by the timing controller 142 or the display system. The STV signal reflects at least one of the abnormality of the OE signal, the abnormality of the VGH voltage, and the abnormality of the VGL voltage, and therefore it is not necessary to provide new wiring for leading such signals for the purpose of detecting the at least one of the abnormality of the OE signal, the abnormality of the VGH voltage, and the abnormality of the VGL voltage. Further, the STV signal reflects at least one of the abnormality of the OE signal, the abnormality of the VGH voltage, and the abnormality of the VGL voltage, and therefore it is not necessary to provide, on the outside of the gate driver IC 124, a new detection circuit for detecting the at least one of the abnormality of the OE signal, the abnormality of the VGH voltage, and the abnormality of the VGL voltage. Accordingly, the liquid crystal panel, and further, the liquid crystal display device, can be prevented from increasing in size. Further, it is not necessary to increase the number of pins to connect to the display system side through an interface. For the reasons above, increase in a manufacturing cost of the liquid crystal display device can also be prevented.

Note that, configurations other than such configurations as illustrated in the specification of this application may be omitted as appropriate. That is, as long as at least such configurations are provided, the effects described above can be generated. However, even in a case where at least one configuration out of other configurations illustrated in the specification of this application is added to the configurations described above as appropriate, i.e., even in a case where other configurations that are illustrated in the specification of this application but not described as the configurations described above are added to the configurations described above, the effects described above can be generated similarly.

Further, according to the preferred embodiments described above, the abnormality of the OE signal includes a state in which the OE signal is constantly a High-level voltage, or a state in which the OE signal is constantly a Low-level voltage. According to such a configuration, in the determination circuit 242, determination whether or not the output of the XOR circuit 240 and the shift clock signal are equal to each other enables determination of the abnormal state of the OE signal.

Further, according to the preferred embodiments described above, the abnormality of the VGH includes a state in which the VGH is not input into the gate driver IC. According to such a configuration, in the comparator circuit 272, determination whether or not the output signal of the dummy circuit 406a and the output signal in the final stage inside the gate driver IC may be compared to each other enables determination of the state of the abnormality of the VGH.

Further, according to the preferred embodiments described above, the abnormality of the VGL includes a state in which the VGL is not input into the gate driver IC. According to such a configuration, in the comparator circuit 272, determination whether or not the output signal of the dummy circuit 406a and the output signal in the final stage inside the gate driver IC may be compared to each other enables determination of the state of the abnormality of the VGL.

Further, according to the preferred embodiments described above, the waveform-changing part fixes the STV signal to be a Low-level voltage, repeats the STV signal, or fixes the STV signal to be a High-level voltage, thereby changing the waveform of the STV signal. According to such a configuration, at least one of the abnormality of the OE signal, the abnormality of the VGH voltage, and the abnormality of the VGL voltage is reflected in the change of the waveform of the STV signal, thereby being capable of detecting abnormality of the liquid crystal display based on the STV signal having a waveform that is different from a normal waveform.

Further, according to the preferred embodiments described above, the abnormality detection part includes the AND circuit 220 into which the OE signal and the shift clock signal of the gate driver IC are to be input, and the determination circuit 222 into which a branch signal of the shift clock signal and the output signal of the AND circuit 220 are to be input and which determines the abnormality of the OE signal based on a time length in which the branch signal of the shift clock signal and the output signal of the AND circuit 220 are equal to each other. According to such a configuration, when determination is made whether or not the output of the AND circuit 220 and the shift clock signal are equal to each other in the determination circuit 222, a state in which the OE signal is fixed to be a High-level voltage, i.e., the abnormal state of the OE signal, can be determined based on a time length in which such an output and a signal are determined to be equal to each other. Then, in a case where the OE signal is in an abnormal state, the determination circuit 222 outputs a signal.

Further, according to the preferred embodiments described above, the abnormality detection part includes the XOR circuit 240 into which the OE signal and the shift clock signal of the gate driver IC are to be input, and the determination circuit 242 into which a branch signal of the shift clock signal and the output signal of the XOR circuit 240 are to be input and which determines the abnormality of the OE signal based on a time length in which the branch signal of the shift clock signal and the output signal of the XOR circuit 240 are equal to each other. According to such a configuration, when determination is made whether or not the output of the XOR circuit 240 and the shift clock signal are equal to each other in the determination circuit 242, the abnormal state of the OE signal can be determined. Then, in a case where the OE signal is in an abnormal state, the determination circuit 242 outputs a signal.

Further, according to the preferred embodiments described above, the abnormality detection part includes a first comparator circuit for determining the abnormality of the VGH based on a result of comparing a preset first reference voltage and the VGH. Here, the first reference voltage corresponds to the reference voltage V1, for example. Further, the first comparator circuit corresponds to the comparator circuit 260, for example. According to such a configuration, in a case where the VGH is equal to or lower than the reference voltage V1, i.e., in a case where the absolute value of the VGH is smaller than the absolute value of the reference voltage V1, the comparator circuit 260 can output a signal determining that the VGH is in an abnormal state.

Further, according to the preferred embodiments described above, the driver IC includes a first resistor for changing the first reference voltage. Here, the first resistor corresponds to the external resistor attached in the wiring that is input to the comparator circuit 260, for example. According to such a configuration, the determination criteria in the comparator circuit 260 can be adjusted.

Further, according to the preferred embodiments described above, the abnormality detection part includes a second comparator circuit for determining the abnormality of the VGL based on a result of comparing a preset second reference voltage and the VGL. Here, the second reference voltage corresponds to the reference voltage V2, for example. Further, the second comparator circuit corresponds to the comparator circuit 262, for example. According to such a configuration, in a case where the VGL is equal to or higher than the reference voltage V2, i.e., in a case where the absolute value of the VGL is smaller than the absolute value of the reference voltage V2, the comparator circuit 262 can output a signal determining that the VGL is in an abnormal state.

Further, according to the preferred embodiments described above, the driver IC includes a second resistor for changing the second reference voltage. Here, the second resistor corresponds to the external resistor attached in the wiring path that is input to the comparator circuit 262, for example. According to such a configuration, the determination criteria in the comparator circuit 262 can be adjusted.

Further, according to the preferred embodiments described above, the abnormality detection part includes a third comparator circuit for determining the abnormality of the VGH and the abnormality of the VGL based on a result of comparing a signal output to the output amplifier circuit 406 (first output amplifier circuit) inside the gate driver IC and a signal being a branch signal of the subject signal input thereto through the dummy circuit 406a (second output amplifier circuit). Here, the third comparator circuit corresponds to the comparator circuit 272, for example. According to such a configuration, in a case where the VGH voltage or the VGL voltage is not input into the gate driver IC, the comparator circuit 272 compares the output signal of the dummy circuit 406a and the output signal in the final stage inside the gate driver IC, and can output an abnormal signal determining that the VGH voltage or the VGL voltage is in an abnormal state.

According to the preferred embodiments described above, in the liquid crystal display device, the above-mentioned driver IC is provided.

According to such a configuration, abnormality of the liquid crystal display can be detected based on the STV signal reflecting at least one of the abnormality of the OE signal, the abnormality of the VGH voltage, and the abnormality of the VGL voltage while preventing increase in the number of wires in the liquid crystal display device. Specifically, the waveform-changing circuit 701 changes the STV signal based on a signal output from the abnormality detection circuit. Then, the changed STV signal is received by the timing controller 142 or the display system, thereby detecting abnormality of the liquid crystal display.

Modified Examples in Preferred Embodiments Described Above

In the preferred embodiments described above, even quality of a material, a material, a dimension, a shape, a relative arrangement relationship, a condition of implementation, and the like of each of the components are described in some cases, but those are merely an example in all aspects, and are not to be limited to those described in the specification of this application.

Accordingly, numerous modified examples not illustrated herein and equivalents are assumable within the scope of the technology disclosed in the specification of this application. For example, a case of modifying, adding, or omitting at least one component, and further, a case of combining selected at least one component in at least one preferred embodiment with a component of another preferred embodiment, are encompassed.

Further, unless being contradictory, as for the components described as being "single" in the preferred embodiments described above, "one or more" of the components may be provided.

Moreover, each of the components in the preferred embodiments described above is a conceptional unit, and a case where one component is formed of a plurality of structural objects, a case where one component corresponds to a portion of a certain structural object, and further a case where a plurality of components are provided in one structural object are encompassed within the scope of the technology disclosed in the specification of this application.

Further, in each of the components in the preferred embodiments described above, a structural object having another structure or a shape is encompassed as long as such a structural object exerts the same function.

Further, the description in the specification of this application is referred to for the sake of all the objects in relation to the subject technology, none of which is to be acknowledged as prior art.

Further, in the preferred embodiments described above, in a case where a material name and the like are described without being specified in particular, unless being contradictory, a material in which another additive is contained in the material, such as an alloy, is encompassed.

While the invention has been shown and described in detail, the foregoing description is in all aspects illustrative and not restrictive. It is therefore understood that numerous modifications and variations can be devised without departing from the scope of the invention.

What is claimed is:

1. A driver IC comprising:
    an abnormality detection part for detecting at least one of abnormality of an OE signal being a signal for controlling an output of a gate driver part, abnormality of a VGH being a signal indicating a High-level voltage in a case where a drive transistor in each pixel of a liquid crystal display panel is in an ON state, and abnormality of a VGL being a signal indicating a Low-level voltage in a case where the drive transistor is in an OFF state;
    a waveform-changing part for changing a waveform of an STV signal being a start signal for generating a gate pulse based on a signal output from the abnormality detection part; and
    an output part for outputting the STV signal.

2. The driver IC according to claim 1, wherein the abnormality of the OE signal comprises a state in which the OE signal is constantly a High-level voltage, and a state in which the OE signal is constantly a Low-level voltage.

3. The driver IC according to claim 1, wherein the abnormality of the VGH comprises a state in which the VGH fails to be input into the gate driver part.

4. The driver IC according to claim 1, wherein the abnormality of the VGL comprises a state in which the VGL fails to be input into the gate driver part.

5. The driver IC according to claim 1, wherein the waveform-changing part fixes the STV signal to be a Low-level voltage, repeats the STV signal, or fixes the STV signal to be a High-level voltage, to thereby change the waveform of the STV signal.

6. The driver IC according to claim 1, wherein the abnormality detection part comprises:
    an AND circuit into which the OE signal and a shift clock signal of the gate driver part are to be input; and
    a determination circuit into which a branch signal of the shift clock signal and an output signal of the AND circuit are to be input and which determines abnormality of the OE signal based on a time length in which the branch signal of the shift clock signal and the output signal of the AND circuit are equal to each other.

7. The driver IC according to claim 1, wherein the abnormality detection part comprises:
   an XOR circuit into which the OE signal and a shift clock signal of the gate driver part are to be input; and
   a determination circuit into which a branch signal of the shift clock signal and an output signal of the XOR circuit are to be input and which determines abnormality of the OE signal based on a time length in which the branch signal of the shift clock signal and the output signal of the XOR circuit are equal to each other.

8. The driver IC according to claim 1, wherein the abnormality detection part comprises a first comparator circuit for determining the abnormality of the VGH based on a result of comparing a preset first reference voltage and the VGH.

9. The driver IC according to claim 8, wherein the gate driver part further comprises a first resistor for changing the first reference voltage.

10. The driver IC according to claim 1, wherein the abnormality detection part comprises a second comparator circuit for determining the abnormality of the VGL based on a result of comparing a preset second reference voltage and the VGL.

11. The driver IC according to claim 10, wherein the gate driver part further comprises a second resistor for changing the second reference voltage.

12. The driver IC according to claim 1, wherein the abnormality detection part comprises a third comparator circuit for determining the abnormality of the VGH and the abnormality of the VGL based on a result of comparing a signal output to an output amplifier circuit inside the gate driver part and a signal being a branch signal of the signal input thereto through a dummy circuit.

13. A liquid crystal display device comprising the driver IC of claim 1.

* * * * *